(12) United States Patent
Jin et al.

(10) Patent No.: US 11,558,960 B2
(45) Date of Patent: Jan. 17, 2023

(54) VOLTAGE REGULATOR MODULE AND VOLTAGE REGULATION DEVICE WITH SAME

(71) Applicant: Delta Electronics, Inc., Taoyuan (TW)

(72) Inventors: Da Jin, Taoyuan (TW); Xueliang Chang, Taoyuan (TW); Yahong Xiong, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/476,019

(22) Filed: Sep. 15, 2021

(65) Prior Publication Data

US 2022/0007509 A1 Jan. 6, 2022

Related U.S. Application Data

(63) Continuation of application No. 16/887,791, filed on May 29, 2020, now Pat. No. 11,160,167.

(30) Foreign Application Priority Data

Jun. 4, 2019 (CN) .......................... 201910481366.8
Feb. 28, 2020 (CN) .......................... 202010127444.7

(51) Int. Cl.
*H01F 27/24* (2006.01)
*H02M 3/158* (2006.01)
(Continued)

(52) U.S. Cl.
CPC .............. *H05K 1/181* (2013.01); *H01F 27/24* (2013.01); *H01F 27/28* (2013.01); *H02M 3/04* (2013.01);
(Continued)

(58) Field of Classification Search
CPC .......... H02M 3/04; H02M 3/28; H02M 3/158; H02M 3/1584; H02M 7/003; H02M 7/217;
(Continued)

(56) References Cited

U.S. PATENT DOCUMENTS 7,289,329 B2 * 10/2007 Chen .................... H01F 27/2804
336/200
10,193,442 B2 * 1/2019 Parto ................. H02M 3/33561
(Continued)

*Primary Examiner* — Gary L Laxton
(74) *Attorney, Agent, or Firm* — Kirton McConkie; Evan R. Witt

(57) ABSTRACT

A voltage regulator module includes a circuit board, a positive input terminal, a negative input terminal, a positive output terminal, a negative output terminal, a switching circuit, a magnetic element and an input capacitor. The switching circuit is disposed on a top surface of the circuit board, and comprises two switches connected in series to form a midpoint, wherein the switching circuit is connected to the positive input terminal. The magnetic element comprises a magnetic core and a conductive structure in the circuit board, wherein the magnetic element and the switching circuit are arranged on the circuit board along a first direction, the conductive structure is connected to the midpoint of the corresponding switching circuit and the positive output terminal. The input capacitor is connected to the positive input terminal and the negative input terminal, and disposed on a bottom surface of the circuit board.

24 Claims, 16 Drawing Sheets

(51) Int. Cl.
| | |
|---|---|
| H05K 1/18 | (2006.01) |
| H02M 3/04 | (2006.01) |
| H05K 1/11 | (2006.01) |
| H05K 1/14 | (2006.01) |
| H01F 27/28 | (2006.01) |
| H02M 3/28 | (2006.01) |
| H02M 7/00 | (2006.01) |
| H02M 7/217 | (2006.01) |

(52) U.S. Cl.
CPC ......... *H02M 3/158* (2013.01); *H02M 3/1584* (2013.01); *H02M 3/28* (2013.01); *H02M 7/003* (2013.01); *H02M 7/217* (2013.01); *H05K 1/111* (2013.01); *H05K 1/115* (2013.01); *H05K 1/144* (2013.01); *H05K 1/182* (2013.01); *H05K 2201/1003* (2013.01); *H05K 2201/10015* (2013.01)

(58) Field of Classification Search
CPC ........ H05K 1/181; H05K 1/111; H05K 1/115; H05K 1/144; H05K 1/182; H05K 2201/1003; H05K 2201/10015; H01F 27/24; H01F 27/28
See application file for complete search history.

(56) References Cited

U.S. PATENT DOCUMENTS

| | | | |
|---|---|---|---|
| 2006/0038549 A1* | 2/2006 | Mehrotra | H02M 7/003 323/306 |
| 2011/0032683 A1* | 2/2011 | Li | H05K 7/1432 361/760 |
| 2018/0092210 A1* | 3/2018 | Wang | H05K 3/341 |
| 2019/0098802 A1 | 3/2019 | Mokler et al. | |
| 2020/0294708 A1* | 9/2020 | Ishizawa | H01F 30/06 |

* cited by examiner

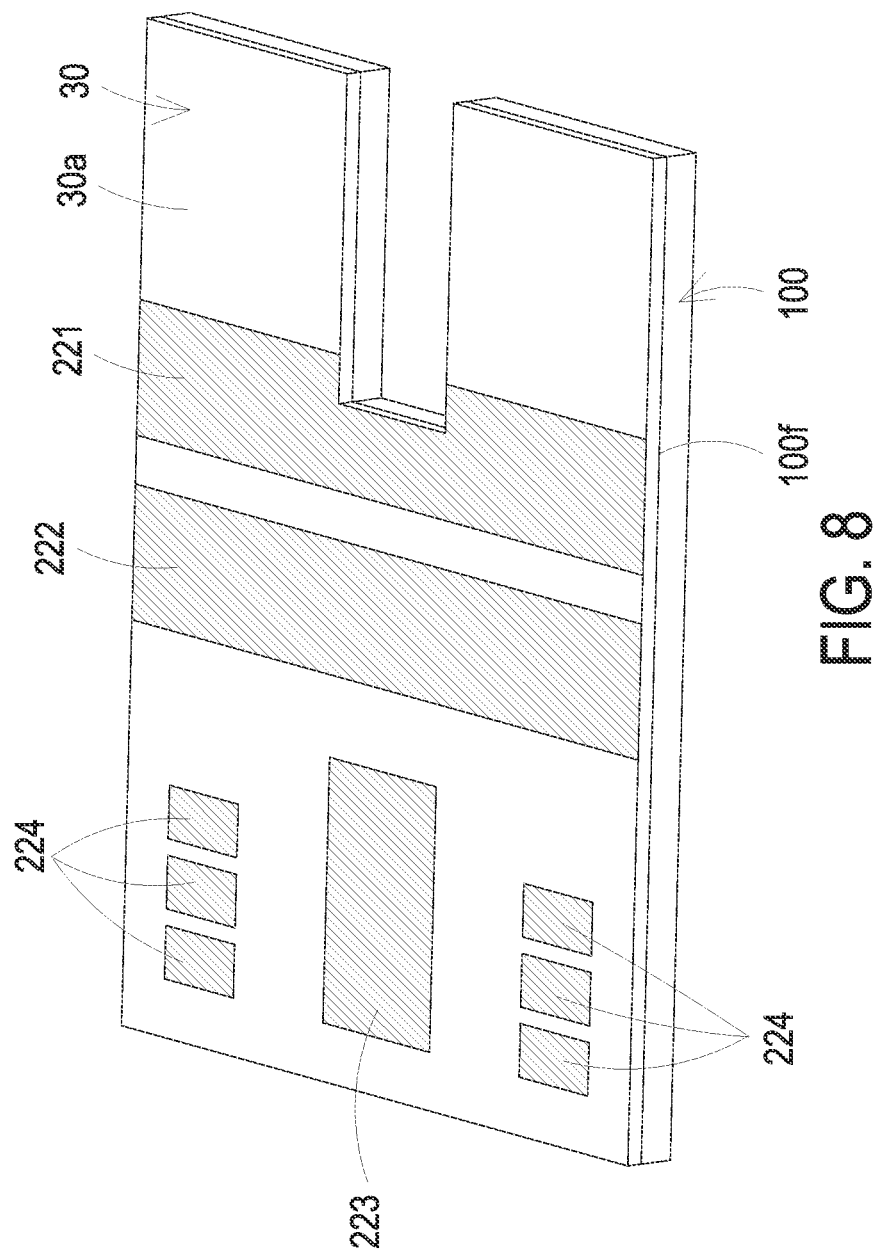

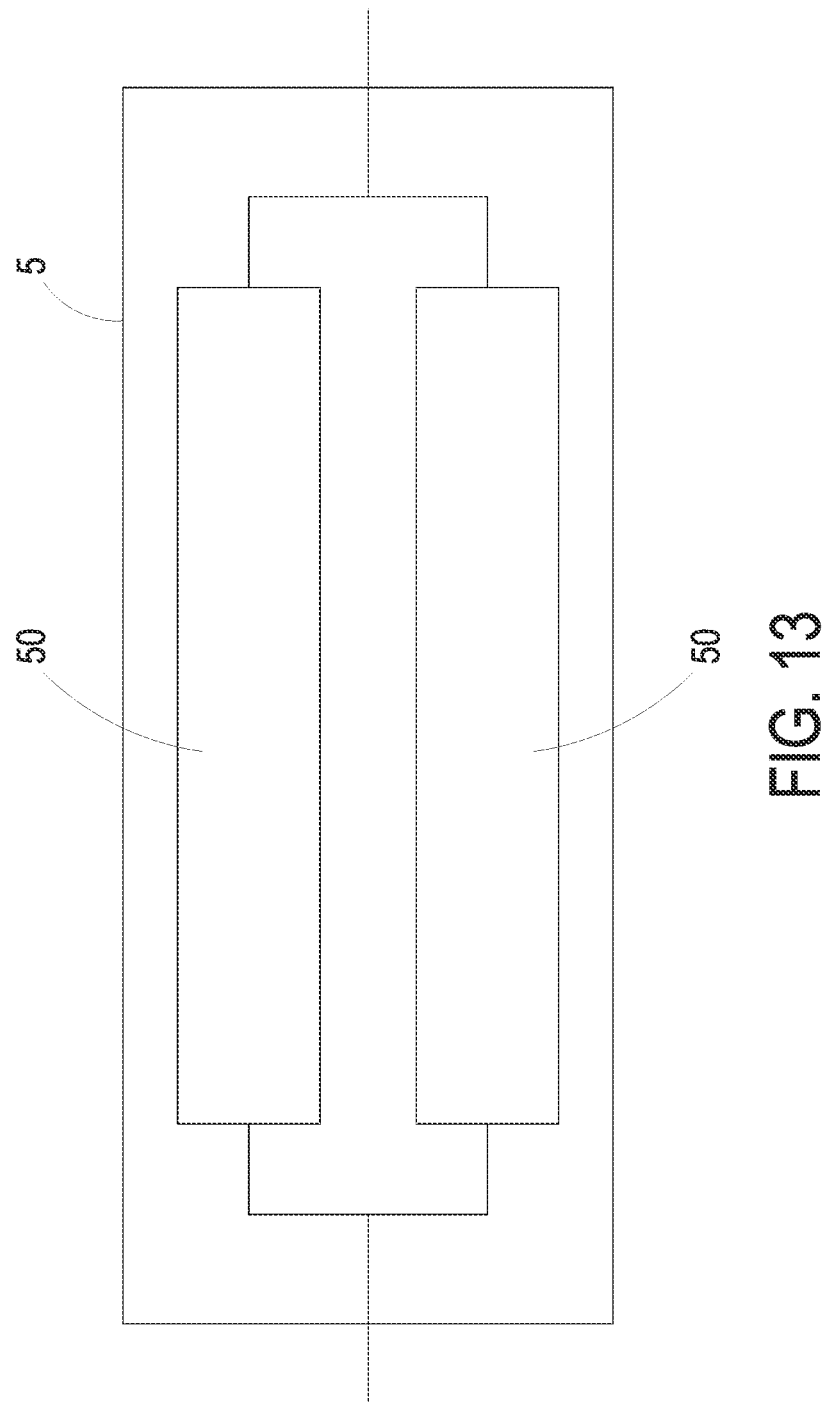

VOLTAGE REGULATOR MODULE AND VOLTAGE REGULATION DEVICE WITH SAME

CROSS-REFERENCE TO RELATED APPLICATION

This application is a Continuation Application of U.S. patent application Ser. No. 16/887,791 filed on May 29, 2020 and entitled "VOLTAGE REGULATOR MODULE AND VOLTAGE REGULATION DEVICE WITH SAME", which claims priority to China Patent Application No. 201910481366.8 filed on Jun. 4, 2019, and claims priority to China Patent Application No. 202010127444.7 filed on Feb. 28, 2020, the entire contents of which are incorporated herein by reference for all purposes.

FIELD OF THE INVENTION

The present disclosure relates to a voltage regulator module, and more particularly to a voltage regulator module with reduced thickness.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 includes a central processing unit (CPU) 11, a voltage regulator module 12 and a system board 13. The voltage regulator module 12 is used for converting an input voltage into a regulated voltage and providing the regulated voltage to the central processing unit 11. The voltage regulator module 12 and the central processing unit 11 are disposed on opposite surfaces of the system board 13. For example, the voltage regulator module 12 is disposed on a bottom surface of the system board 13, and the central processing unit 11 is disposed on a top surface of the system board 13. Consequently, the electronic device 1 has a vertical layout structure. Due to the vertical layout structure, the transmission distance between the output terminal of the voltage regulator module 12 and an input terminal of the central processing unit 11 is reduced, the resistance of the power transmission path is reduced, and the load dynamic switching performance is enhanced.

The voltage regulator module 12 further includes a circuit board 15 and a magnetic element 16. The magnetic element 16 (e.g., an inductor) is disposed on the circuit board 15. Moreover, a switching circuit is disposed in a vacant space between the circuit board 15 and the magnetic element 16. In other words, the switching circuit and the magnetic element 16 are arranged along the vertical direction. Consequently, the occupied area of the voltage regulator module 12 along the horizontal direction is reduced.

However, according to the requirements, the power density for the system board 13 is gradually increased and the thickness for the system board 13 is gradually decreased. Consequently, the voltage regulator module 12 are developed toward small thickness (e.g., smaller than 5 mm, or smaller than or equal to 3 mm). Since the switching circuit and the magnetic element 16 are arranged along the vertical direction, the thickness of the voltage regulator module 12 is still large.

Therefore, there is a need of providing an improved voltage regulator module and a voltage regulation device in order to overcome the drawbacks of the conventional technologies.

SUMMARY OF THE INVENTION

An object of the present disclosure provides a voltage regulator module with reduced thickness.

Another object of the present disclosure provides a voltage regulation device with the voltage regulator module.

In accordance with an aspect of the present disclosure, a voltage regulator module is provided. The voltage regulator includes a circuit board, a positive input terminal, a negative input terminal, a positive output terminal, a negative output terminal, at least one switching circuit, at least one magnetic element and at least one input capacitor. The at least one switching circuit is disposed on a top surface of the circuit board, and comprises at least two switches connected in series to form a midpoint, wherein a first terminal of the switching circuit is connected to the positive input terminal. The at least one magnetic element comprises a magnetic core and at least one conductive structure in the circuit board, wherein the magnetic core and the at least one conductive structure are assembled together, wherein the at least one magnetic element and the at least one switching circuit are arranged on the circuit board along a first direction, a first terminal of the at least one conductive structure is connected to the midpoint of the corresponding switching circuit, and a second terminal of the at least one conductive structure is connected to the positive output terminal. The at least one input capacitor is connected to the positive input terminal and the negative input terminal, and disposed on a bottom surface of the circuit board.

In accordance with another aspect of the present disclosure, a voltage regulation device is provided. The voltage regulation device is disposed on a system board. The voltage regulation device includes a plurality of voltage regulator modules. The plurality of voltage regulator modules are connected with each other in parallel. The circuitry structures of the plurality of voltage regulator modules are identical. Each voltage regulator module includes a circuit board, a positive input terminal, a negative input terminal, a positive output terminal, a negative output terminal, at least one switching circuit, at least one magnetic element and at least one input capacitor. The at least one switching circuit is disposed on a top surface of the circuit board, and comprises at least two switches connected in series to form a midpoint, wherein a first terminal of the switching circuit is connected to the positive input terminal. The at least one magnetic element comprises a magnetic core and at least one conductive structure in the circuit board, wherein the magnetic core and the at least one conductive structure are assembled together, wherein the at least one magnetic element and the at least one switching circuit are arranged on the circuit board along a first direction, a first terminal of the at least one conductive structure is connected to the midpoint of the corresponding switching circuit, and a second terminal of the at least one conductive structure is connected to the positive output terminal. The at least one input capacitor is connected to the positive input terminal and the negative input terminal, and disposed on a bottom surface of the circuit board.

The above contents of the present disclosure will become more readily apparent to those ordinarily skilled in the art after reviewing the following detailed description and accompanying drawings, in which:

BRIEF DESCRIPTION OF THE DRAWINGS

FIG. 8 is a schematic perspective view illustrating a portion of a voltage regulator module according to a fifth embodiment of the present disclosure;

FIG. 13 schematically a voltage regulation device according to an embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
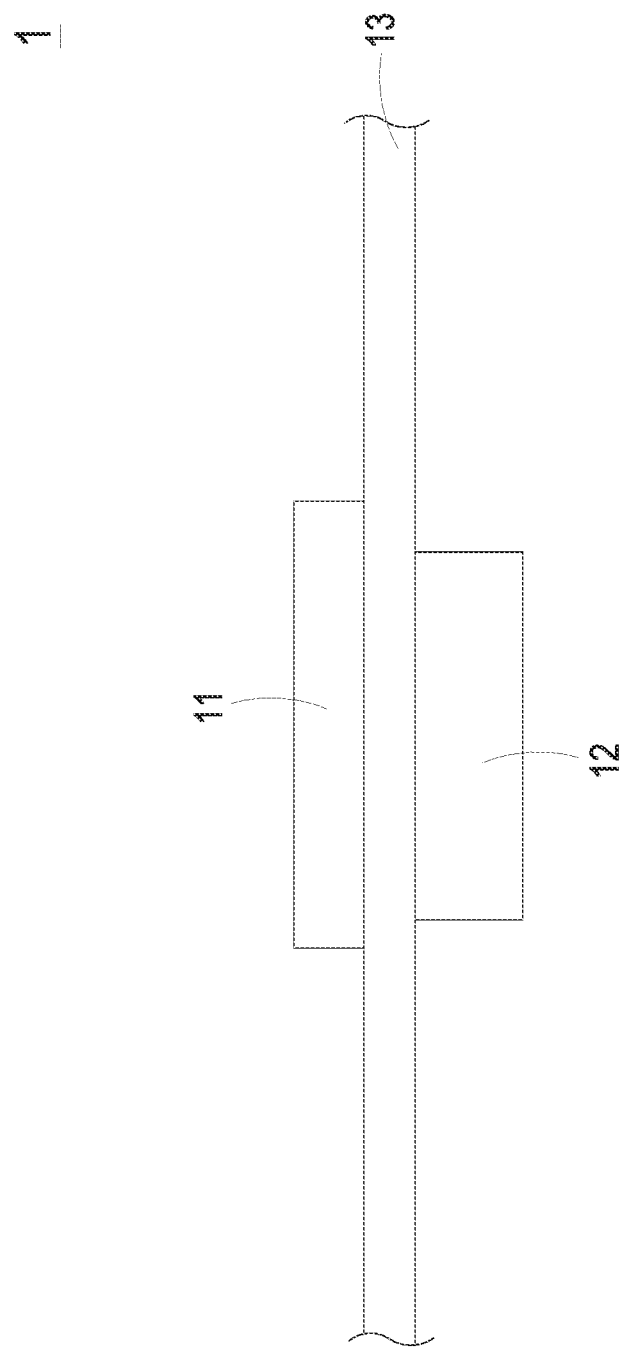
FIG. 1A schematically illustrates the structure of a conventional electronic device.
Figure 1B:
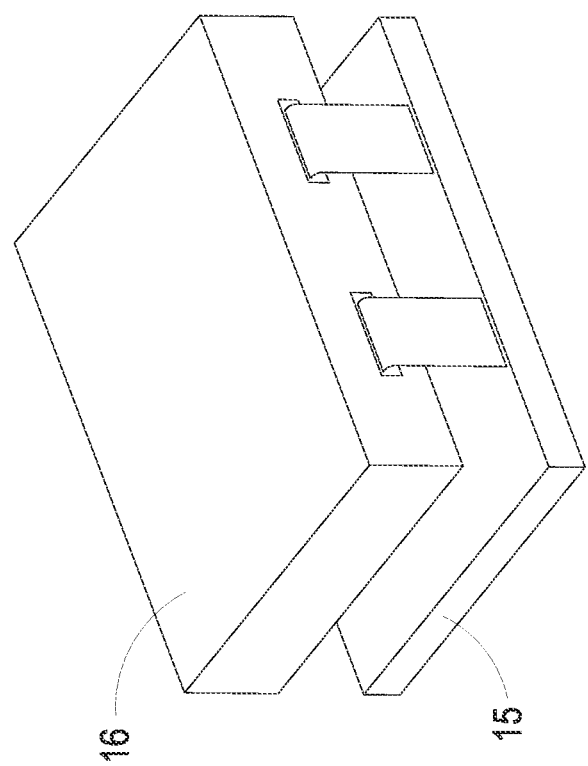
FIG. 1B schematically illustrates the structure of a voltage regulator module of the electronic device as shown in FIG. 1A.
Figure 2:
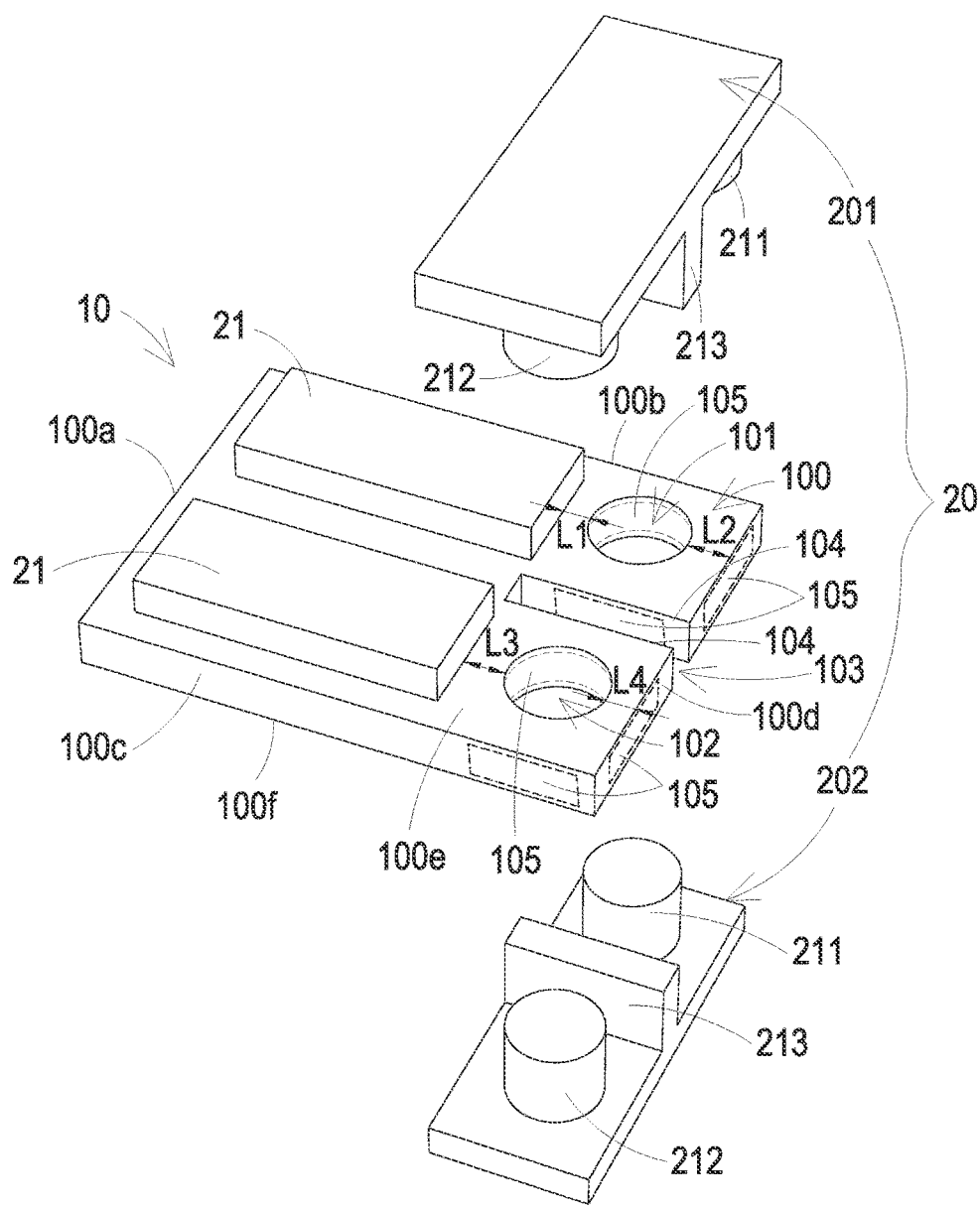
FIG. 2 is a schematic exploded view illustrating the structure of a voltage regulator module according to a first embodiment of the present disclosure.
Figure 3A:
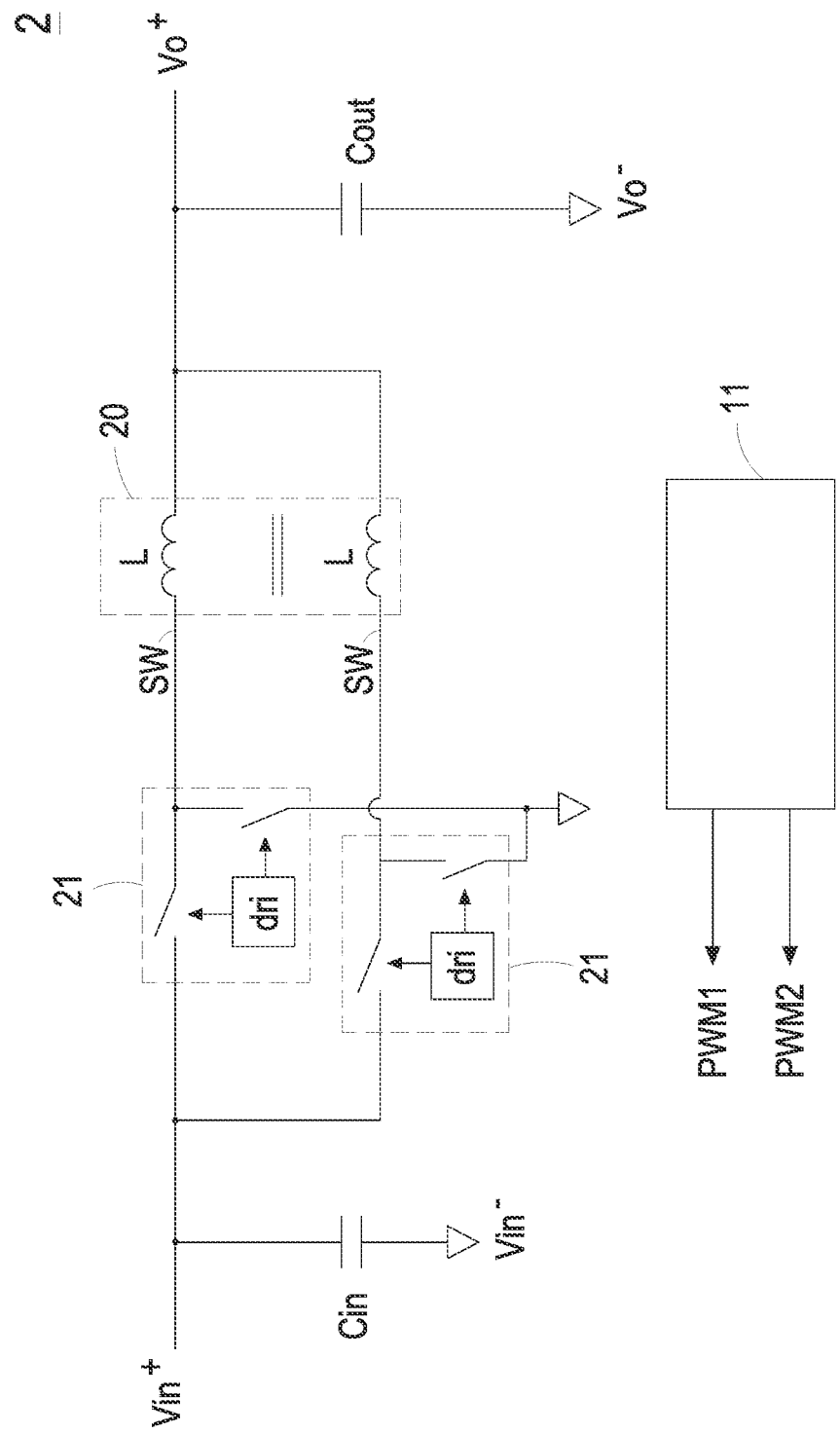
FIG. 3A is a schematic equivalent circuit diagram illustrating a first application example of the voltage regulator module as shown in FIG. 2.
Figure 3B:
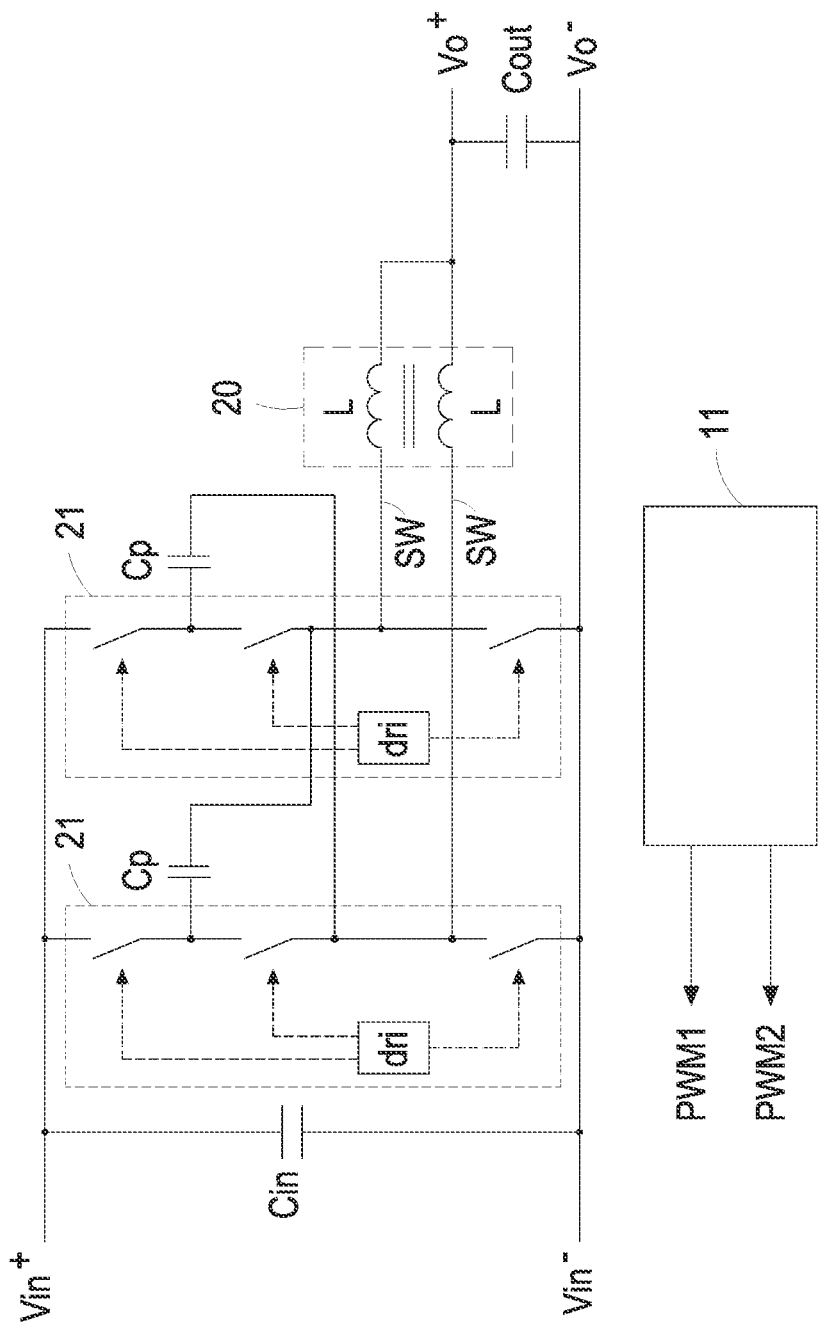
FIG. 3B is a schematic equivalent circuit diagram illustrating a second application example of the voltage regulator module as shown in FIG. 2.

Please refer to FIGS. 2, 3A and 3B. FIG. 2 is a schematic exploded view illustrating the structure of a voltage regulator module according to a first embodiment of the present disclosure. In the drawings, the x-axis direction, the y-axis direction and the z-axis direction are referred as a first direction, a second direction and a third direction, respectively, wherein the third direction also referred as a third-party direction. FIG. 3A is a schematic equivalent circuit diagram illustrating a first application example of the voltage regulator module as shown in FIG. 2. FIG. 3B is a schematic equivalent circuit diagram illustrating a second application example of the voltage regulator module as shown in FIG. 2. The voltage regulator module 2 may be disposed in an electronic device and welded on a system board (not shown) within the electronic device.

As shown in FIG. 3A, the voltage regulator module 2 includes two single-phase buck circuits, an input capacitor Cin and an output capacitor Cout. Each single-phase buck circuit includes a driver switching unit 21 (also referred as a switching circuit 21) and an inductor L. The switching circuit 21 includes a driver and a switch element. In other words, the voltage regulator module 2 includes two switching circuits 21 and two inductors L. In some embodiments, each switching circuit 21 includes at least two switch elements. The at least two switch elements are connected with each other in series.

Each switching circuit 21 and a first terminal SW of the corresponding inductor L are electrically connected with each other in series to define the corresponding single-phase buck circuit. The two single-phase buck circuits are connected with each other in parallel to define a two-phase buck circuit. Each switching circuit 21 has three terminals including a first terminal, a second terminal and a third terminal. The input side of the voltage regulator module 2 includes a positive input terminal Vin+ and a negative input terminal Vin−. The first terminals of the two switching circuits 21 are connected with each other and connected to a first terminal of the input capacitor Cin and the positive input terminal Vin+. The second terminals of the two switching circuits 21 are connected with each other and connected to a second terminal of the input capacitor Cin and the negative input terminal Vin−. The third terminals of the two switching circuits 21 are electrically connected with the first terminals SW of the two inductors L, respectively. The second terminals of the two inductors L are connected with each other and connected to a first terminal of the output capacitor Cout. The output side of the voltage regulator module 2 includes a positive output terminal Vo+ and a negative output terminal Vo−. The first terminal of the output capacitor Cout is electrically connected with the positive output terminal Vo+. A second terminal of the output capacitor Cout is electrically connected with the negative output terminal Vo−. The negative input terminal Vin− and the negative output terminal Vo− are electrically connected with each other.

As shown in FIG. 3B, the voltage regulator module 2 includes two switching circuits 21, two inductors L, two storage capacitors Cp, an input capacitor Cin and an output capacitor Cout. Each switching circuit 21 has four terminals including a first terminal, a second terminal, a third terminal and a fourth terminal. The input side of the voltage regulator module 2 includes a positive input terminal Vin+ and a negative input terminal Vin−. The first terminals of the two switching circuits 21 are connected with each other and connected to a first terminal of the input capacitor Cin and the positive input terminal Vin+. The second terminals of the two switching circuits 21 are connected with each other and connected to a second terminal of the input capacitor Cin and the negative input terminal Vin−. The third terminals of the two switching circuits 21 are electrically connected with first terminals of the two storage capacitors Cp, respectively. The fourth terminals of the two switching circuits 21 are electrically connected with second terminals of the two storage capacitors Cp and first terminals of the two inductors L, respectively. The second terminals of the two inductors L are connected with each other and connected to a first terminal of the output capacitor Cout. The output side of the voltage regulator module 2 includes a positive output terminal Vo+ and a negative output terminal Vo−. The first terminal of the output capacitor Cout is electrically connected with the positive output terminal Vo+. A second terminal of the output capacitor Cout is electrically connected with the negative output terminal Vo−. The negative input terminal Vin− and the negative output terminal Vo− are electrically connected with each other.

In the embodiment of FIG. 3A or 3B, each switching circuit 21 includes a switch and a driver for driving the switch. The voltage regulator module 2 further includes a control circuit 11. After the control circuit 11 samples the output voltage and the output current of the voltage regulator module 2, the control circuit 11 generates two pulse width modulation signals PWM1 and PWM2. The two switching circuits 21 are controlled according to the first pulse width modulation signal PWM1 and the second pulse width modulation signal PWM2, respectively. The phase difference between the two pulse width modulation signals is in the range between 150 and 210 degree (e.g., 180 degree). In an embodiment, the output capacitor Cout is disposed in the voltage regulator module 2. In another embodiment, the output capacitor Cout is disposed on the system board.

Please refer to FIG. 2. Structurally, the voltage regulator module 2 includes a circuit board assembly 10 and a magnetic core assembly 20. The circuit board assembly 10 includes a circuit board 100 and two switching circuits 21. The circuit board 100 includes at least one conductive structure (not shown). The conductive structure is a planar winding assembly that is formed through the trace pattern of the circuit board 100. The circuit board 100 includes a first lateral edge 100a, a second lateral edge 100d, a third lateral edge 100b, a fourth lateral edge 100c, a top surface 100e and a bottom surface 100f. The first lateral edge 100a and the second lateral edge 100d are opposed to each other. The third lateral edge 100b and the fourth lateral edge 100c are arranged between the first lateral edge 100a and the second lateral edge 100d. Moreover, the third lateral edge 100b and the fourth lateral edge 100c are opposed to each other. The top surface 100e and the bottom surface 100f are opposed to each other.

Figure 7A:
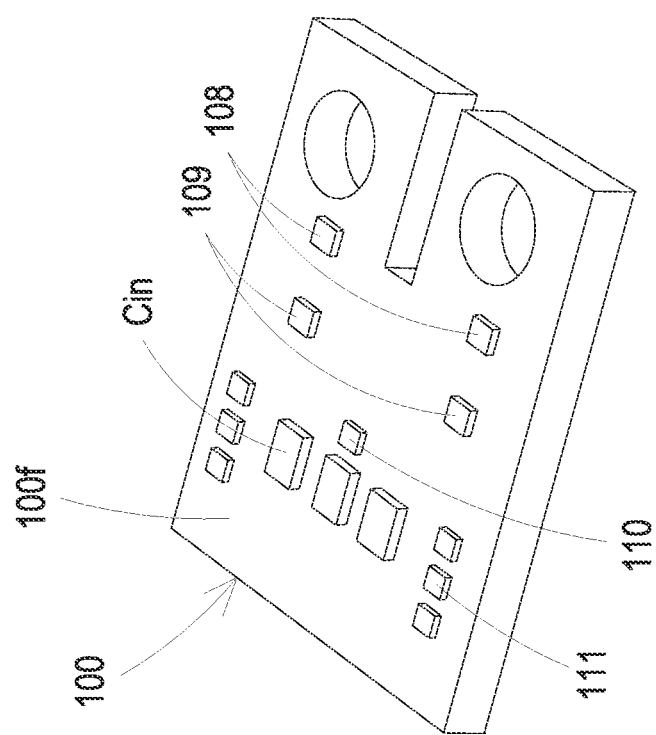
FIG. 7A is a schematic perspective view illustrating a portion of a voltage regulator module according to a third embodiment of the present disclosure.

The capacitor group as shown in FIG. 3A (e.g., the input capacitor Cin) or the capacitor group as shown in FIG. 3B (e.g., the input capacitor Cin and the storage capacitors Cp) are mounted on the bottom surface 100f of the circuit board 100 by a welding process or through a conductive adhesive (see also FIG. 7A). The two switching circuits 21 are mounted on the top surface 100e of the circuit board 100 by a welding process or through a conductive adhesive. The two switching circuits 21 are arranged side by side along the second direction. For clarification, the two switching circuits 21 are defined as one switching circuit group. The switching circuit group is located beside the first lateral edge 100a, the third lateral edge 100b and the fourth lateral edge 100c of the circuit board 100. The first terminals of the two switching circuits 21 are connected to a first terminal of the switching circuit group. The second terminals of the two switching circuits 21 are connected to a second terminal of the switching circuit group. Moreover, one input capacitor Cin is shared by the two switching circuits 21. In this embodiment, the input capacitor Cin is located beside the first terminal of the switching circuit group and disposed on the bottom surface 100f of the circuit board 100. Consequently, the parasitic parameters between the two switching circuits 21 and the input capacitor Cin are minimized. In an embodiment, the first terminal of the switching circuit group corresponds to all pins at the first terminals of the two switching circuits 21 or any pin at the first terminals of the two switching circuits 21. Moreover, the input capacitor Cin and the switch circuits are located over or under the conductive structure along the third direction.

As mentioned above, the phase difference between the two pulse width modulation signals is in the range between 150 and 210 degree (e.g., 180 degree). The ripple current frequency of the input capacitor Cin is two times the switching frequency of the voltage regulator module 2. Consequently, the ripple current of the input capacitor Cin and the power loss of the input capacitor Cin are reduced. Moreover, the size of the input capacitor Cin can be reduced, and thus the volume of the voltage regulator module 2 can be reduced.

In the embodiment of FIG. 3B, the storage capacitors Cp are located beside the pins corresponding to the third terminal of one switching circuit 21 and the fourth terminal of the other switching circuit 21. Moreover, the storage capacitors Cp are disposed on the bottom surface 100f of the circuit board 100. Consequently, the parasitic parameters between the two switching circuits 21 and the storage capacitors Cp are minimized, and the power loss of the storage capacitors Cp is reduced.

The magnetic core assembly 20 includes an upper core 201, a lower core 202, lateral legs 211, 212 and a middle leg 213. The upper core 201 is disposed on the top surface 100e of the circuit board 100. The lower core 202 is aligned with the upper core 201 and disposed on the bottom surface 100f of the circuit board 100. The lateral legs 211, 212 and the middle leg 213 are arranged between the upper core 201 and the lower core 202. Moreover, the lateral legs 211, 212 and the middle leg 213 are penetrated through corresponding planar winding assemblies in the circuit board 100. Moreover, two inductors L are defined by the upper core 201, the lower core 202, the lateral legs 211, 212, the middle leg 213 and the planar winding assemblies collaboratively. The two inductors L are magnetic integrated inductors. Consequently, the volume of the inductors L is reduced. Each inductor L is electrically connected with one corresponding switching circuit 21. Moreover, the two inductors L are defined as one inductor group. The inductor group and the switching circuit group are horizontally arranged on the circuit board 100 along the first direction.

As mentioned above, the two inductors L and two switching circuits 21 of the voltage regulator module 2 are horizontally arranged on the circuit board 100. As previously described, the switching circuit and the magnetic core assembly of the conventional voltage regulator module are arranged along the vertical direction. When compared with the conventional voltage regulator module, the height of the voltage regulator module 2 of the present disclosure is largely reduced. Moreover, since the two inductors L of the voltage regulator module 2 are magnetic integrated inductors, the volume of the inductors L is reduced. In other words, the volume and the height of the voltage regulator module 2 can be further reduced. For example, the overall thickness of the voltage regulator module 2 is less than or equal to 5 mm, preferably less than or equal to 3 mm. Consequently, the voltage regulator module 2 can meet the requirement of ultra-slimness. Moreover, the two inductors L and two switching circuits 21 of the voltage regulator module 2 are closely and horizontally arranged on the circuit board 100 along the first direction, and the capacitor group is disposed on the bottom surface 100f of the circuit board 100 and aligned with the two switching circuits 21. The two switching circuits 21 are controlled by the two pulse width modulation signals. The phase difference between the two pulse width modulation signals is in the range between 150 and 210 degree (e.g., 180 degree). Consequently, the parasitic parameters between the two switching circuits 21 and the input capacitor Cin (and/or the storage capacitors Cp) are minimized. Consequently, the power loss of the input capacitor Cin and the storage capacitors Cp is reduced, and the size of the overall product is reduced. In other words, the voltage regulator module 2 has many benefits such as miniaturization, small package area and high power density.

In an embodiment, portions of the lateral posts 211 and 212 are formed on the upper cover 201, and the other portions of the lateral posts 211 and 212 are formed on the lower core 202. Moreover, the circuit board 100 includes two openings 101 and 102. The two openings 101 and 102 are arranged between the corresponding switching circuits 21 and the second lateral edge 100d of the circuit board 100. The two openings 101 and 102 run through the circuit board 100. Moreover, the opening 101 is aligned with the lateral leg 211, and the opening 102 is aligned with the lateral leg 212. When the upper core 201 is disposed on the top surface 100e of the circuit board 100 and the lower core 202 is disposed on the bottom surface 100f of the circuit board 100, the lateral legs 101 and 102 are respectively penetrated through the openings 101 and 102 and accommodated within the circuit board 100. Consequently, the two inductors L are defined by the upper core 201, the lower core 202, the lateral legs 211, 212, the middle leg 213 and the planar winding assemblies collaboratively. Moreover, the planar winding assemblies are located beside the second lateral edge 100d, the third lateral edge 100b and the fourth lateral edge 100c of the circuit board 100. Namely, the magnetic core assembly 20 is located beside the second lateral edge 100d, the third lateral edge 100b and the fourth lateral edge 100c of the circuit board 100.

Preferably, the shortest distance L1 between the opening 101 and the corresponding switching circuit 21 is less than the shortest distance L2 between the opening 101 and the second lateral edge 100d, and the shortest distance L3 between the opening 102 and the corresponding switching circuit 21 is smaller than the shortest distance L4 between the opening 102 and the second lateral edge 100d. That is, the two inductors L are located beside the corresponding switching circuits 21. Since the transmission path between the planar winding assembly of the inductor L and the corresponding switching circuit 21 is reduced, the power loss is reduced.

Due to the size limitation of the voltage regulator module 2, the width of the planar winding assembly in the circuit board 100 is restricted. Consequently, the resistance of the planar winding assembly is increased, and the power loss is still high. For addressing this drawback, at least one electroplated structure 105 is formed on the second lateral edge 100d, the third lateral edge 100b and the fourth lateral edge 100c of the circuit board 100 and the inner walls of the openings 101 and 102. The at least one electroplated structure 105 is electrically connected with at least one planar winding assembly of the multilayered winding assembly of the circuit board 100. In case that a plurality of winding assemblies are connected with each other in parallel through the at least one electroplated structure 105, the power loss of the planar winding assemblies is reduced.

Figure 4:
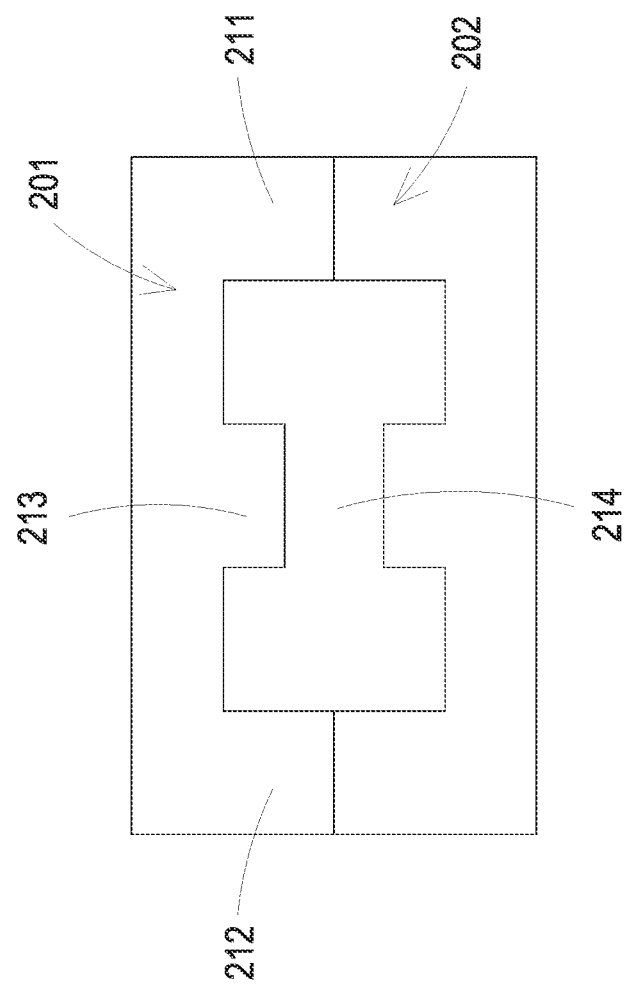
FIG. 4 is a schematic cross-sectional view illustrating the magnetic core assembly of the voltage regulator module as shown in FIG. 2.

FIG. 4 is a schematic cross-sectional view illustrating the magnetic core assembly of the voltage regulator module as shown in FIG. 2. As mentioned above, the inductors L are magnetic integrated inductors. In an embodiment, a portion of the middle post 213 is formed on the upper cover 201, and the other portion of the middle post 213 is formed on the lower core 202. Moreover, the magnetic core assembly 20 further includes an air gap 214. The air gap 214 is formed in the middle post 213. Due to the arrangement of the middle post 213, the upper core 201 and the lower core 202 can be locked on the circuit board 100. In an embodiment, the circuit board 100 further includes a receiving recess 103. The receiving recess 103 is concavely formed on a middle region of the second lateral edge 100d of the circuit board 100. Moreover, the receiving recess 103 is arranged between the two openings 101 and 102 and aligned with the middle post 213. The size of the receiving recess 103 matches the size of the middle post 213. Moreover, the inner walls 104 of the receiving recess 103 are located beside and adjacent to the second lateral edge 100d of the circuit board 100. When the upper core 201 is disposed on the top surface 100e of the circuit board 100 and the lower core 202 is disposed on the bottom surface 100f of the circuit board 100, the middle post 213 is accommodated within the receiving recess 103.

It is noted that numerous modifications and alterations may be made while retaining the teachings of the disclosure. In another embodiment, air gaps are formed in the two lateral legs 211 and 212 of the magnetic core assembly 20. Preferably but not exclusively, the air gap of the middle leg 213 is greater than or equal to the air gaps of the two lateral legs 211 and 212. In case that the winding directions of the planar winding assemblies of the circuit board 100 are specially designed, the directions of the DC magnetic fluxes flowing through the lateral legs 211 and 212 are identical and the directions of the AC magnetic fluxes are opposite. Consequently, the ripple current of the equivalent inductor is largely reduced, and the ability of the inductor L to withstand saturation is largely enhanced.

In another embodiment, the lateral legs 211 and 212 and the middle leg 213 are all formed on the upper cover 201 or the lower cover 202. For example, the lateral legs 211 and 212 and the middle leg 213 are all formed on the upper cover 201 and penetrated through the openings 101 and 102 and the receiving recess 103, respectively. Consequently, the circuit board 100 is clamped between the upper cover 201 and the lower cover 202. Moreover, the middle leg 213 has an air gap. Consequently, two magnetic integrated inductors L are defined by the magnetic core assembly 20 and the planar winding assemblies collaboratively.

Moreover, in the embodiment of FIG. 3B, a larger duty cycle D of the switch element in the switching circuit may be used. The AC magnetic flux density may be calculated according to the following formula:

$$B_{ac} = \frac{V_o \cdot (1-D) \cdot T_{SW}}{N \cdot A_e},$$

In case that the output voltage $V_o$, the switching cycle $T_{SW}$, the transformer primary side turn number N and the AC magnetic flux density $B_{ac}$ are fixed, the higher duty cycle D can reduce the value of magnetic core effective cross section area Ae. Consequently, the magnetic core thickness is reduced, and the thickness of the voltage regulator module 2 is reduced. Moreover, in case that the cross section area of the middle leg 213 of the magnetic core assembly 20 is reduced and the width of the planar winding assembly of the circuit board 100 is increased, the parasitic resistance and the DC power loss of the planar winding assembly are reduced. Moreover, since the voltage regulator module of FIG. 3B is operated at the larger duty cycle, the coupling effect of the two magnetic integrated inductors L is enhanced and the equivalent inductance is reduced. Moreover, since the switch element of the switching circuit 21 withstands the reduced voltage, the parasitic capacitance of the corresponding switch element and the switching loss are reduced and the working frequency of the circuitry topology is further increased. Since the size of the magnetic core assembly is reduced, the voltage regulator module has the benefits of slimness, small size and high power density.

In some embodiments, the planar winding assemblies of the two inductors L are partially exposed to the inner walls 104 of the receiving recess 103, and the at least one electroplated structure 105 is formed on the inner walls 104 of the receiving recess 103. The at least one electroplated structure 105 is electrically connected with at least one planar winding assembly of the multilayered winding assembly of the circuit board 100. Consequently, the power loss of the planer winding assemblies is reduced. Alternatively, a plurality of winding assemblies are connected with each other in parallel.

Figure 5:
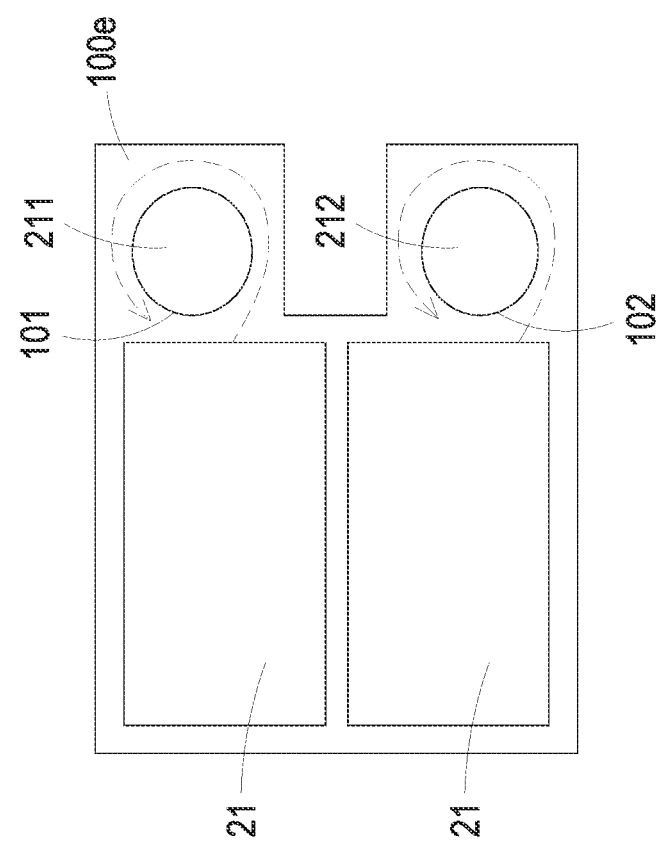
FIG. 5 schematically illustrates the directions of the currents flowing through two inductors of the voltage regulator module as shown in FIG. 2.

FIG. 5 schematically illustrates the directions of the currents flowing through two inductors of the voltage regulator module as shown in FIG. 2. Please refer to FIGS. 3A, 3B, 4 and 5. As shown in the drawings, the currents from the two switching circuits 21 flow through the two lateral legs 211 and 212 of the magnetic core assembly 20 in a counterclockwise direction. Consequently, the directions of the DC magnetic fluxes flowing through the lateral legs 211 and 212 are identical and the DC magnetic loss is reduced. Moreover, since the two switching circuits 21 are controlled according to the first pulse width modulation signal PWM1 and the second pulse width modulation signal PWM2 with the phase difference, the directions of the AC magnetic fluxes flowing through the two lateral legs 211 and 212 are opposite. Consequently, the AC magnetic fluxes are partially or completely balanced out, the AC magnetic loss is reduced, the ripple current of the equivalent inductance is largely reduced, and the ability of the inductors L to withstand the saturation is enhanced.

The directions of the currents flowing through the inductors L are not restricted as long as the directions of the DC magnetic fluxes flowing through the lateral legs 211 and 212 are identical and the directions of the AC magnetic fluxes are opposite. For example, in another embodiment, the currents flow through the two lateral legs 211 and 212 of the magnetic core assembly 20 in a clockwise direction. The phase difference between the two pulse width modulation signals PWM1, PWM2 is in the range between 150 and 210 degree (e.g., 180 degree). Consequently, the AC magnetic loss is obviously reduced, and the ripple current of the inductors is decreased.

Figure 6:
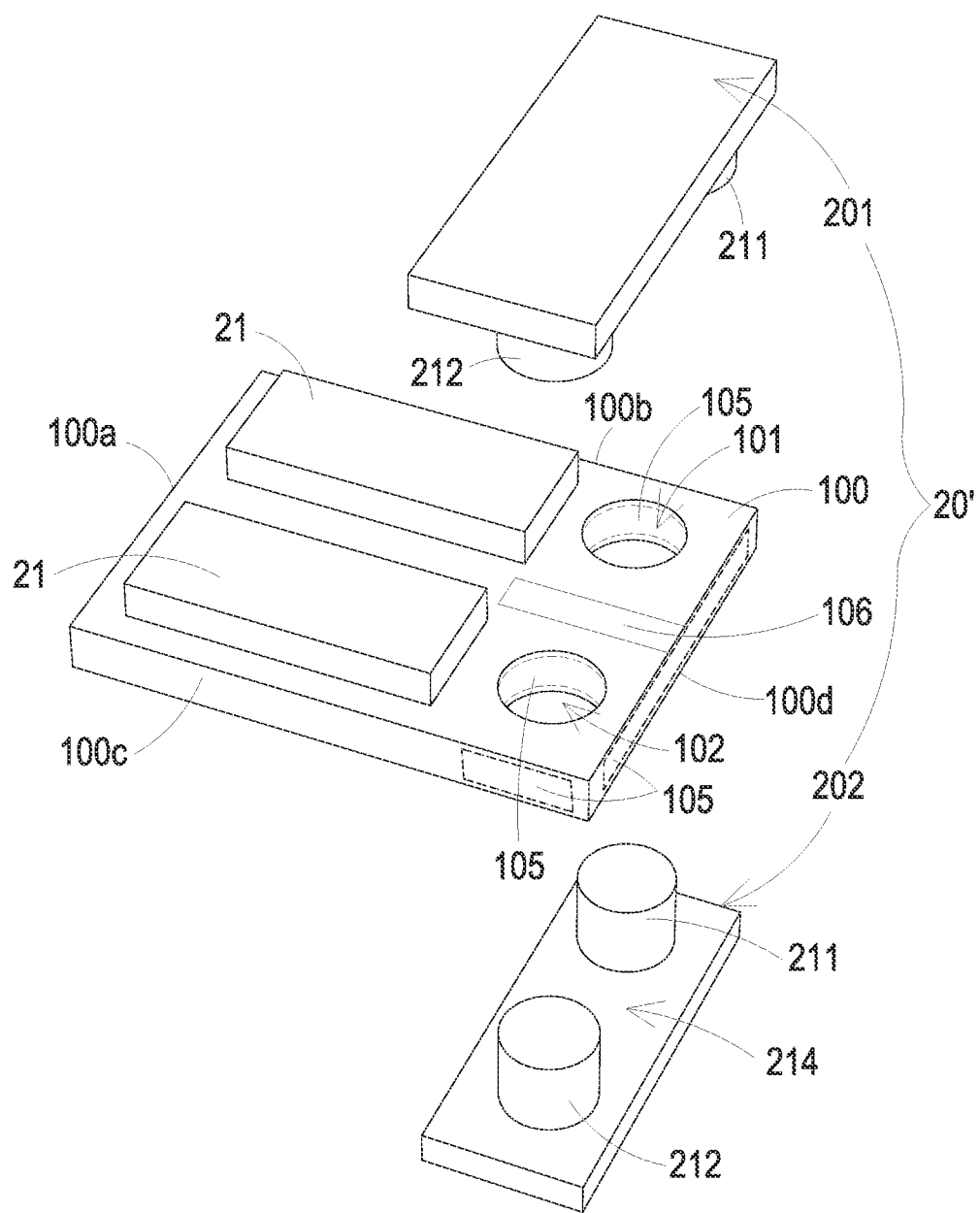
FIG. 6 is a schematic exploded view illustrating the structure of a voltage regulator module according to a second embodiment of the present disclosure.

FIG. 6 is a schematic exploded view illustrating the structure of a voltage regulator module according to a second embodiment of the present disclosure. In comparison with the first embodiment, the magnetic core assembly 20' of the voltage regulator module 2a of this embodiment omits the middle leg. That is, the magnetic core assembly 20' includes the two lateral legs 211 and 212 only, and the entire of the middle leg 213 of the first embodiment is replaced by the air gap 214. Moreover, the circuit board 100 omits the receiving recess 103. Furthermore, the circuit board 100 further includes a clearance region 106. The clearance region 106 is arranged between the openings 101 and 102. Especially, no electronic components, planar winding assemblies or electric traces are located at the region of the circuit board 100 corresponding to the clearance region 106. Consequently, the magnetic force lines with the direction opposite to the magnetic force lines of the lateral legs 211 and 212 can pass through the circuit board 100 through the clearance region 106.

FIG. 7A is a schematic perspective view illustrating a portion of a voltage regulator module according to a third embodiment of the present disclosure. In comparison with the first embodiment, a plurality of copper blocks 108, 109, 110 and 111 are disposed on the bottom surface 100f of the circuit board 100 of the voltage regulator module 2b. The plurality of copper blocks 108, 109, 110 and 111 are electrically connected with the corresponding terminals of the voltage regulator module 2b (e.g., the positive input terminal, the negative input terminal, the positive output terminal, the negative output terminal and the signal terminals). That is, the plurality of copper blocks 108, 109, 110 and 111 are used as the corresponding pins of the voltage regulator module 2b. Moreover, the capacitor group of the voltage regulator module 2b (e.g., input capacitors Cin) are disposed on the bottom surface 100f of the circuit board 100.

Figure 7B:
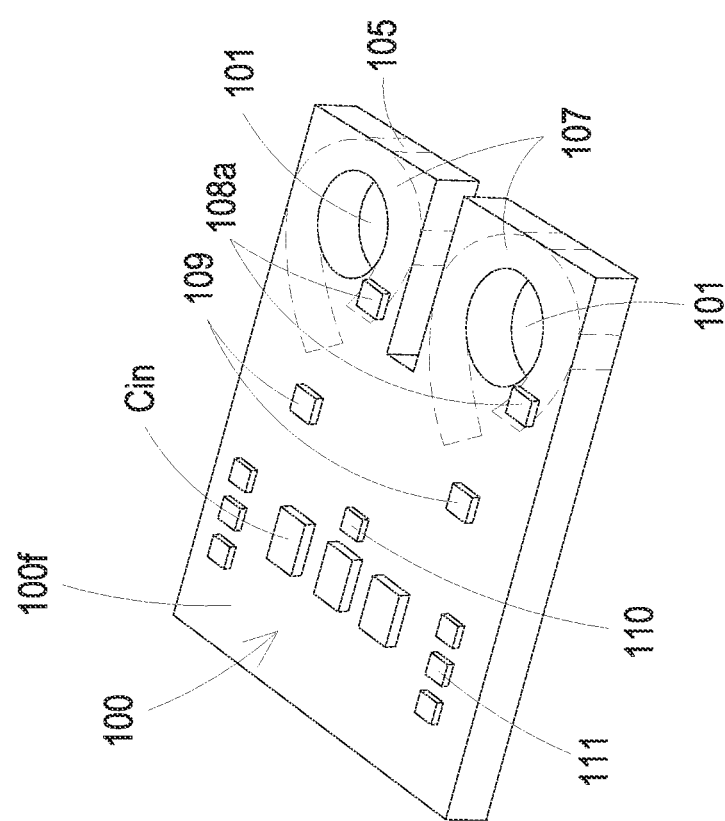
FIG. 7B is a schematic perspective view illustrating a portion of a voltage regulator module according to a fourth embodiment of the present disclosure.

It is noted that the conductive structure is not restricted to the planar winding assembly. FIG. 7B is a schematic perspective view illustrating a portion of a voltage regulator module according to a fourth embodiment of the present disclosure. As shown in FIG. 7B, two copper blocks 107 are embedded in the circuit board 100 of the voltage regulator module 2c to replace the planar winding assemblies of the first embodiment or the second embodiment. That is, the at least one winding structure includes the two copper blocks 107, and the two copper blocks 107 are used as the winding assemblies of the two inductors L. The two copper blocks 107 are aligned with the openings 101 and 102, respectively. The first terminals of the copper blocks 107 are electrically connected with the corresponding switching circuits 21. Two pins 108a are placed on the bottom surface 100f of the circuit board 100 and electrically connected with the corresponding copper blocks 107. Alternatively, the two pins 108a are integrally formed with the corresponding copper blocks 107. That is, at least portions of the second terminals of the copper blocks 107 are exposed to the bottom surface 100f of the circuit board 100 and formed as the pins 108a. The pins 108a are connected with the positive output terminal Vo+ of the voltage regulator module 2c. As shown in FIG. 7B, the capacitor group of the voltage regulator module 2c (e.g., input capacitors Cin) are disposed on the bottom surface 100f of the circuit board 100. Moreover, a plurality of copper blocks 109, 110 and 111 are disposed on the bottom surface 100f of the circuit board 100. The copper blocks 109, 110 and 111 are electrically connected with the corresponding terminals of the voltage regulator module 2c (e.g., the positive input terminal, the negative output terminal and the signal terminals). That is, the plurality of copper blocks 109, 110 and 111 are used as the corresponding pins of the voltage regulator module 2c.

FIG. 8 is a schematic perspective view illustrating a portion of a voltage regulator module according to a fifth embodiment of the present disclosure. In comparison with the above embodiments, the voltage regulator module 2d of this embodiment further includes a molding compound layer 30. The molding compound layer 30 is disposed on the bottom surface 100f of the circuit board 100. The capacitor group and the copper blocks (e.g., the copper blocks 108, 109, 110 and 111 as shown in FIG. 7A or the copper blocks 109, 110, 111 and pins 108a as shown in FIG. 7B) and the bottom surface 100f of the circuit board 100 are encapsulated by the molding compound layer 30. After the capacitor group and the copper blocks on the bottom surface 100f of the circuit board 100 are encapsulated by the molding compound layer 30, the molding compound layer 30 is polished. Consequently, the copper blocks on the bottom surface 100f of the circuit board 100 are exposed to an external surface 30a of the molding compound layer 30. Moreover, a plurality of electroplated patterns are formed on the external surface 30a of the molding compound layer 82 by an electroplating process. The plurality of electroplated patterns are aligned with the corresponding copper blocks that are exposed to the external surface 30a of the molding compound layer 30. The area of each electroplated pattern is greater than the cross-section area of the corresponding copper block. The electroplated patterns can be used as the pins of the voltage regulator module 2d. These pins can be used as the positive output terminal Vo+, the negative output terminal Vo−, the positive input terminal Vin+ and the signal terminals of the voltage regulator module 2d. As shown in FIG. 8, at least one electroplated pattern 221 is used as the positive output terminal Vo+ of the voltage regulator module 2d, at least one electroplated pattern 222 is used as the negative output terminal Vo− of the voltage regulator module 2d, at least one electroplated pattern 223 is used as the positive input terminal Vin+ of the voltage regulator module 2d, and at least one electroplated pattern 224 is used as the signal terminal of the voltage regulator module 2d.

It is noted that the number of the electroplated patterns and the positions of the electroplated patterns are not restricted. That is, the number of the electroplated patterns and the positions of the electroplated patterns may be varied according to the practical requirements. As the area of the electroplated pattern is increased, the weldable area of the voltage regulator module is increased. Consequently, when the voltage regulator module on the system board undergoes a reflow soldering process, the inner components to be reheated are not detached or shifted. In other words, the current density of the solder joint is largely reduced, and the reliability of the product is largely enhanced.

Figure 9:
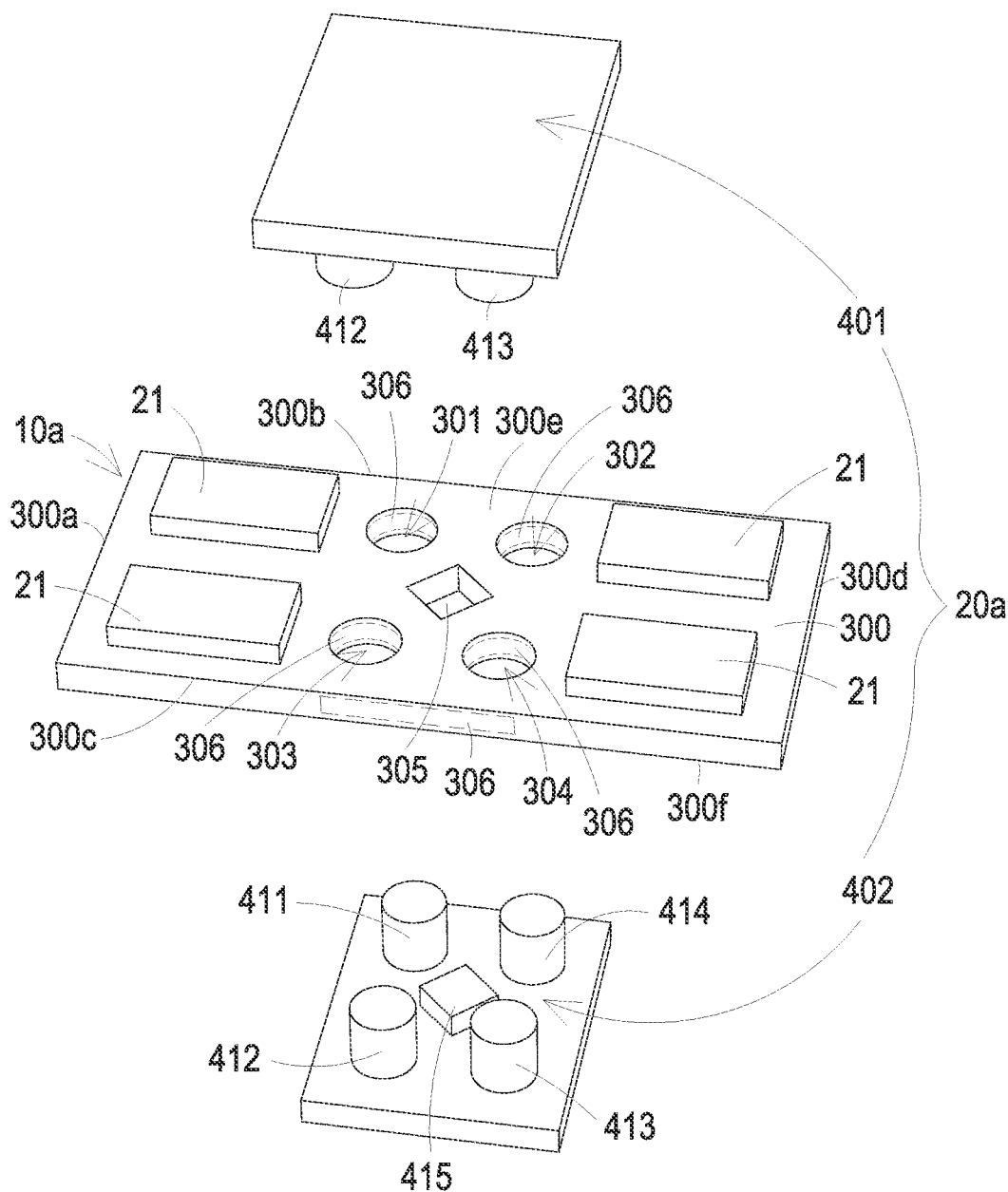
FIG. 9 is a schematic exploded view illustrating the structure of a voltage regulator module according to a sixth embodiment of the present disclosure.
Figure 10:
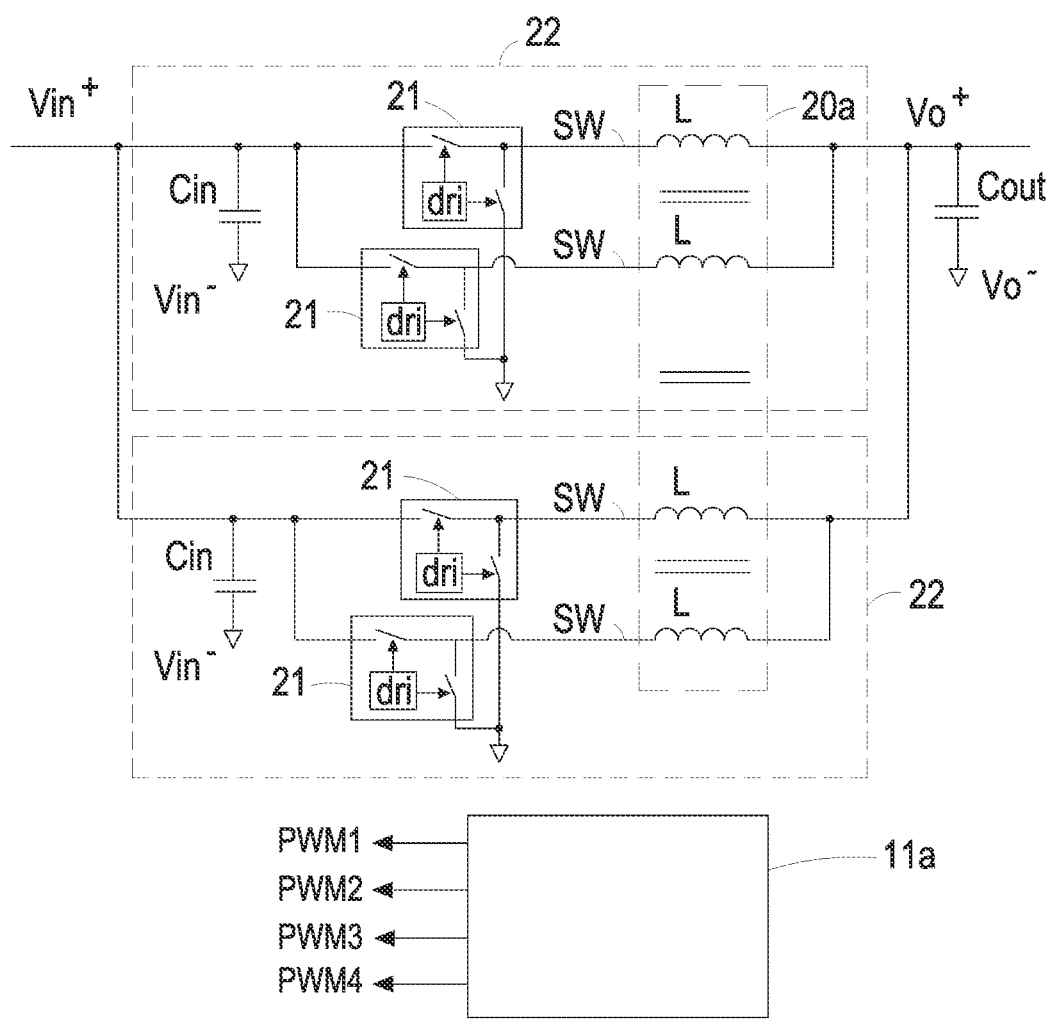
FIG. 10 is a schematic equivalent circuit diagram illustrating the voltage regulator module as shown in FIG. 9.

Please refer to FIGS. 9 and 10. FIG. 9 is a schematic exploded view illustrating the structure of a voltage regulator module according to a sixth embodiment of the present disclosure. FIG. 10 is a schematic equivalent circuit diagram illustrating the voltage regulator module as shown in FIG. 9. The voltage regulator module 2e may be disposed in an electronic device and welded on a system board (not shown) within the electronic device. Component parts and elements corresponding to those of the first embodiment are designated by identical numeral references, and detailed descriptions thereof are omitted.

In this embodiment, the voltage regulator module 2e includes four single-phase buck circuits and an output capacitor Cout. The four single-phase buck circuits are connected with each other to define a four-phase buck circuit. Moreover, two of the four single-phase buck circuits are defined as a first power group 22, and the other single-phase buck circuits are defined as a second power group 22. Each power group 22 further includes at least one input capacitor Cin. The first terminals of the input capacitors Cin of the two power groups 22 are connected with each other and connected to a positive input terminal Vin+ of the voltage regulator module 2e. The second terminals of the input capacitors Cin of the two power groups 22 are connected with each other and connected to a negative input terminal Vin− of the voltage regulator module 2e. The first terminal of the output capacitor Cout is electrically connected with the positive output terminal Vo+. The second terminal of the output capacitor Cout is electrically connected with the negative output terminal Vo−.

Each single-phase buck circuit includes a driver switching unit 21 (also referred as a switching circuit 21) and an inductor L. Each switching circuit 21 and a first terminal SW of the corresponding inductor L are electrically connected with each other in series. Each switching circuit 21 has three terminals including a first terminal, a second terminal and a third terminal. In each power group 22, the first terminals of the two switching circuits 21 are connected with each other and connected to a first terminal of the input capacitor Cin, the second terminals of the two switching circuits 21 are connected with each other and connected to a second terminal of the input capacitor Cin, and the third terminals of the two switching circuits 21 are electrically connected with the first terminals SW of the two inductors L, respectively, and the second terminals of the two inductors L are connected with each other and connected to the first terminal of the output capacitor Cout.

The two single-phase buck circuits of the first power group 22 and the two single-phase buck circuits of the second power group 22 are connected with each other in parallel. In each power group 22, the first terminals of the two single-phase buck circuits are connected with each other and connected to the first terminal of the input capacitor Cin, and the second terminals of the two single-phase buck circuits are connected with the first terminal of the output capacitor Cout. For example, the switching circuit 21 is a driver and metal-oxide-semiconductor field-effect transistor (also referred as a Dr.MOS element). In other words, the voltage regulator module 2e includes four switching circuits 21 and four inductors L.

In each single-phase buck circuit, the switching circuit 21 is connected between the first terminal SW of the corresponding inductor L and the first terminal of the input capacitor Cin. The second terminals of the inductors L of the single-phase buck circuits in each power group 22 are connected with each other and connected with the first terminal of the output capacitor Cout.

Since the four single-phase buck circuits are connected with each other to define the four-phase buck circuit, the ability of the voltage regulator module 2e to output current is effectively increased.

In an embodiment, each switching circuit 21 includes a switch and a driver for driving the switch. Moreover, the voltage regulator module 2 further includes a control circuit 11a. After the control circuit 11a samples the output voltage of the voltage regulator module 2e and the output current of each single-phase buck circuit, the control circuit 11a generates four pulse width modulation signals PWM1, PWM2, PWM3 and PWM4. Every single-phase buck circuit is controlled by the control circuit 11a according to the corresponding pulse width modulation signal. For example, the first single-phase buck circuit of the first power group 22 is controlled according to the first pulse width modulation signal PWM1, the second single-phase buck circuit of the first power group 22 is controlled according to the second pulse width modulation signal PWM2, the first single-phase buck circuit of the second power group 22 is controlled according to the third pulse width modulation signal PWM3, and the second single-phase buck circuit of the second power group 22 is controlled according to the fourth pulse width modulation signal PWM4. The phase difference between the pulse width modulation signals PWM1 and PWM2 is 180 degree. The phase difference between the pulse width modulation signals PWM3 and PWM4 is 180 degree. The phase difference between the pulse width modulation signals PWM1 and PWM3 is 90 degree. The phase difference between the pulse width modulation signals PWM2 and PWM4 is 90 degree.

In an embodiment, the output capacitor Cout is disposed in the voltage regulator module 2e. In another embodiment, the output capacitor Cout is disposed on the system board of the electronic device.

Structurally, the voltage regulator module 2e includes a circuit board assembly 10a and a magnetic core assembly 20a. The circuit board assembly 10a includes a circuit board 300 and four switching circuits 21.

The circuit board 300 includes at least one conductive structure (not shown). The conductive structure is a planar winding assembly that is formed through the trace pattern of the circuit board 300. The circuit board 300 includes a first lateral edge 300a, a second lateral edge 300d, a third lateral edge 300b, a fourth lateral edge 300c, a top surface 300e and a bottom surface 300f. The first lateral edge 300a and the second lateral edge 300d are opposed to each other. The third lateral edge 300b and the fourth lateral edge 300c are arranged between the first lateral edge 300a and the second lateral edge 300d. Moreover, the third lateral edge 300b and the fourth lateral edge 300c are opposed to each other. The top surface 300e and the bottom surface 300f are opposed to each other.

The input capacitor Cin are mounted on the bottom surface 300f of the circuit board 300 by a welding process or through a conductive adhesive (not shown). The four switching circuits 21 are mounted on the top surface 300e of the circuit board 300 by a welding process or through a conductive adhesive.

The two switching circuits 21 of the first power group 22 are arranged side by side on the top surface 300e of the circuit board 300 and defined as a first switching circuit group. The first switching circuit group is located beside the first lateral edge 300a, the third lateral edge 300b and the fourth lateral edge 300c of the circuit board 300. In the first switching circuit group, the first terminals of the two switching circuits 21 are connected to a first terminal of the first switching circuit group, and the second terminals of the two switching circuits 21 are connected to a second terminal of the first switching circuit group. Moreover, one input capacitor Cin is shared by the two switching circuits 21. In this embodiment, the input capacitor Cin is located beside the first terminal of the first switching circuit group and disposed on the bottom surface 300f of the circuit board 300. Consequently, the parasitic parameters between the two switching circuits 21 and the input capacitor Cin are minimized. The ripple current frequency of the input capacitor Cin is two times the switching frequency of the voltage regulator module 2e. Consequently, the ripple current of the input capacitor Cin and the power loss of the input capacitor Cin are reduced. Moreover, the size of the input capacitor Cin can be reduced, and thus the volume of the voltage regulator module 2e can be reduced.

The two switching circuits 21 of the second power group 22 are arranged side by side on the top surface 300e of the circuit board 300 along the second direction and defined as a second switching circuit group. The second switching circuit group is located beside the second lateral edge 300d, the third lateral edge 300b and the fourth lateral edge 300c of the circuit board 300. In the second switching circuit group, the first terminals of the two switching circuits 21 are connected to a first terminal of the second switching circuit group, and the second terminals of the two switching circuits 21 are connected to a second terminal of the second switching circuit group. Moreover, one input capacitor Cin is shared by the two switching circuits 21. In this embodiment, the input capacitor Cin is located beside the first terminal of the second switching circuit group and disposed on the bottom surface 300f of the circuit board 300. Consequently, the parasitic parameters between the two switching circuits 21 and the input capacitor Cin are minimized. The ripple current frequency of the input capacitor Cin is two times the switching frequency of the voltage regulator module 2e. Consequently, the ripple current of the input capacitor Cin and the power loss of the input capacitor Cin are reduced. Moreover, the size of the input capacitor Cin can be reduced, and thus the volume of the voltage regulator module 2e can be reduced.

In an embodiment, the first terminal of each switching circuit group corresponds to all pins at the first terminals of the two switching circuits 21 or any pin at the first terminals of the two switching circuits 21. As shown in FIG. 10, the two switching circuits 21 of the first switching circuit group and the two switching circuits 21 of the second switching circuit group are connected with each other in parallel.

It is noted that numerous modifications and alterations may be made while retaining the teachings of the disclosure. In another embodiment, the input capacitors Cin are embedded in the circuit board 300, and the input capacitors Cin and the conductive structure are located at different layers. Alternatively, the switching circuits 21 are embedded in the circuit board 300, and the switching circuits 21, the conductive structure and the input capacitors Cin are located at different layers.

The magnetic core assembly 20a includes an upper core 401, a lower core 402, four lateral legs 411, 412, 413, 414 and a middle leg 415. The upper core 401 is disposed on the top surface 300e of the circuit board 300. The lower core 402 is aligned with the upper core 401 and disposed on the bottom surface 300f of the circuit board 300. The four lateral legs 411, 412, 413, 414 and the middle leg 415 are arranged between the upper core 401 and the lower core 402. Moreover, four inductors L are defined by the upper core 401, the lower core 402, four lateral legs 411, 412, 413, 414, the middle leg 415 and the planar winding assemblies collaboratively. The four inductors L are magnetic integrated inductors. Consequently, the volume of the inductors L is reduced. The magnetic core assembly 20a and the two switching circuit groups are horizontally arranged on the circuit board 300 along the first direction. Moreover, the magnetic core assembly 20a is disposed on the circuit board 300 and arranged between the two switching circuit groups.

As mentioned above, the magnetic core assembly 20a and the two switching circuit groups are horizontally arranged on the circuit board 300 along the first direction. As previously described, the switching circuit and the magnetic core assembly of the conventional voltage regulator module are arranged along the vertical direction. When compared with the conventional voltage regulator module, the height of the voltage regulator module 2e of the present disclosure is largely reduced. Moreover, the four inductors L of the voltage regulator module 2e are magnetic integrated inductors that are operated according to the four-phase magnetic integration. In comparison with the two-phase magnetic integration, the ability of the four magnetic integrated inductors to balance out the AC magnetic fluxes is increased, and the inductor current ripple is further decreased. In case that the transient current is large, the ability of the inductor L to withstand saturation is largely enhanced. In other words, the volume of the four inductors L is reduced. Consequently, the volume and the height of the voltage regulator module 2e can be further reduced. For example, the overall thickness of the voltage regulator module 2e is less than or equal to 5 mm, preferably less than or equal to 3 mm. Consequently, the voltage regulator module 2 can meet the requirement of ultra-slimness. Moreover, the fourth inductors L and the four switching circuits 21 of the voltage regulator module 2 are closely and horizontally arranged on the circuit board 300, and the input capacitors Cin and the filter capacitor (not shown) are disposed on the bottom surface 300f of the circuit board 300 and aligned with the four switching circuits 21. Consequently, the parasitic parameters between the switching circuits 21 and the input capacitor Cin (and/or the storage capacitors Cp) are minimized. Consequently, the power loss of the input capacitor Cin and the storage capacitors Cp is reduced, and the size of the overall product is reduced. In other words, the voltage regulator module 2e has many benefits such as miniaturization, small package area and high power density.

In an embodiment, portions of the lateral posts 411, 412, 413, 414 are formed on the upper cover 401, and the other portions of the lateral posts 411, 412, 413, 414 are formed on the lower core 402. Moreover, the circuit board 300 includes four openings 301, 302, 303 and 304. The four openings 301, 302, 303 and 304 are located at a middle region of the circuit board 300 and arranged between the four switching circuits 21. The four openings 301, 302, 303 and 304 run through the circuit board 300. The opening 301 is aligned with the lateral leg 411. The opening 302 is aligned with the lateral leg 414. The opening 303 is aligned with the lateral leg 412. The opening 304 is aligned with the lateral leg 413. When the upper core 401 is disposed on the top surface 300e of the circuit board 300 and the lower core 402 is disposed on the bottom surface 300f of the circuit board 300, the lateral posts 411, 412, 413, 414 are respectively penetrated through the openings 301, 303, 304 and 302 and accommodated within the circuit board 300. Consequently, the four inductors L are defined by the upper core 401, the lower core 402, the lateral legs 411, 412, 413, 414, the middle leg 415 and the planar winding assemblies collaboratively. Moreover, the planar winding assemblies are located beside the third lateral edge 300b and the fourth lateral edge 300c of the circuit board 300. Namely, the magnetic core assembly 20a is located beside the third lateral edge 300b and the fourth lateral edge 300c of the circuit board 300.

Due to the size limitation of the voltage regulator module 2e, the width of the planar winding assembly in the circuit board 300 is restricted. Consequently, the resistance of the planar winding assembly is increased, and the power loss is still high. For addressing this drawback, at least one electroplated structure 306 is formed on the third lateral edge 300b and the fourth lateral edge 300c of the circuit board 300 and/or the inner walls of the openings 301, 303, 304 and 302. The at least one electroplated structure 306 is electrically connected with at least one planar winding assembly of the multilayered winding assembly of the circuit board 300. In case that a plurality of winding assemblies are connected with each other in parallel through the at least one electroplated structure 306, the power loss of the planar winding assemblies is reduced.

As mentioned above, the inductors L are magnetic integrated inductors. In an embodiment, a portion of the middle post 415 is formed on the upper cover 401, and the other portion of the middle post 415 is formed on the lower core 402. Moreover, the magnetic core assembly 20a further includes an air gap (not shown). The air gap is formed in the middle post 415. Due to the arrangement of the middle post 415, the upper core 401 and the lower core 402 can be locked on the circuit board 300. In an embodiment, the circuit board 300 further includes a receiving recess 305. The receiving recess 305 is arranged between the openings 301, 302, 303 and 304 and aligned with the middle post 415. The size of the receiving recess 305 matches the size of the middle post 415.

When the upper core 401 is disposed on the top surface 300e of the circuit board 300 and the lower core 402 is disposed on the bottom surface 300f of the circuit board 300, the middle post 413 is accommodated within the receiving recess 305.

It is noted that numerous modifications and alterations may be made while retaining the teachings of the disclosure. In another embodiment, air gaps in are formed in the lateral legs 411, 412, 413 and 414 of the magnetic core assembly 20a. Preferably, the air gap of the middle leg 415 is greater than or equal to the air gaps of the lateral legs 411, 412, 413 and 414. In case that the winding directions of the planar winding assemblies of the circuit board 300 are specially designed, the directions of the DC magnetic fluxes flowing through every two lateral legs 411, 412, 413 and 414 are identical and the directions of the AC magnetic fluxes are opposite. Consequently, the ripple current of the equivalent inductor is largely reduced, and the ability of the inductor L to withstand saturation is largely enhanced.

In another embodiment, the lateral legs 411, 412, 413 and 414 and the middle leg 415 are all formed on the upper cover 401 or the lower cover 402. For example, the lateral legs 411, 412, 413 and 414 and the middle leg 415 are all formed on the upper cover 401 and penetrated through the openings 301, 303, 304 and 302 and the receiving recess 305, respectively. Consequently, the circuit board 300 is clamped between the upper cover 401 and the lower cover 402. Moreover, the middle leg 415 has an air gap. Consequently, the four magnetic integrated inductors L are defined by the magnetic core assembly 20a and the planar winding assemblies collaboratively.

Figure 11:
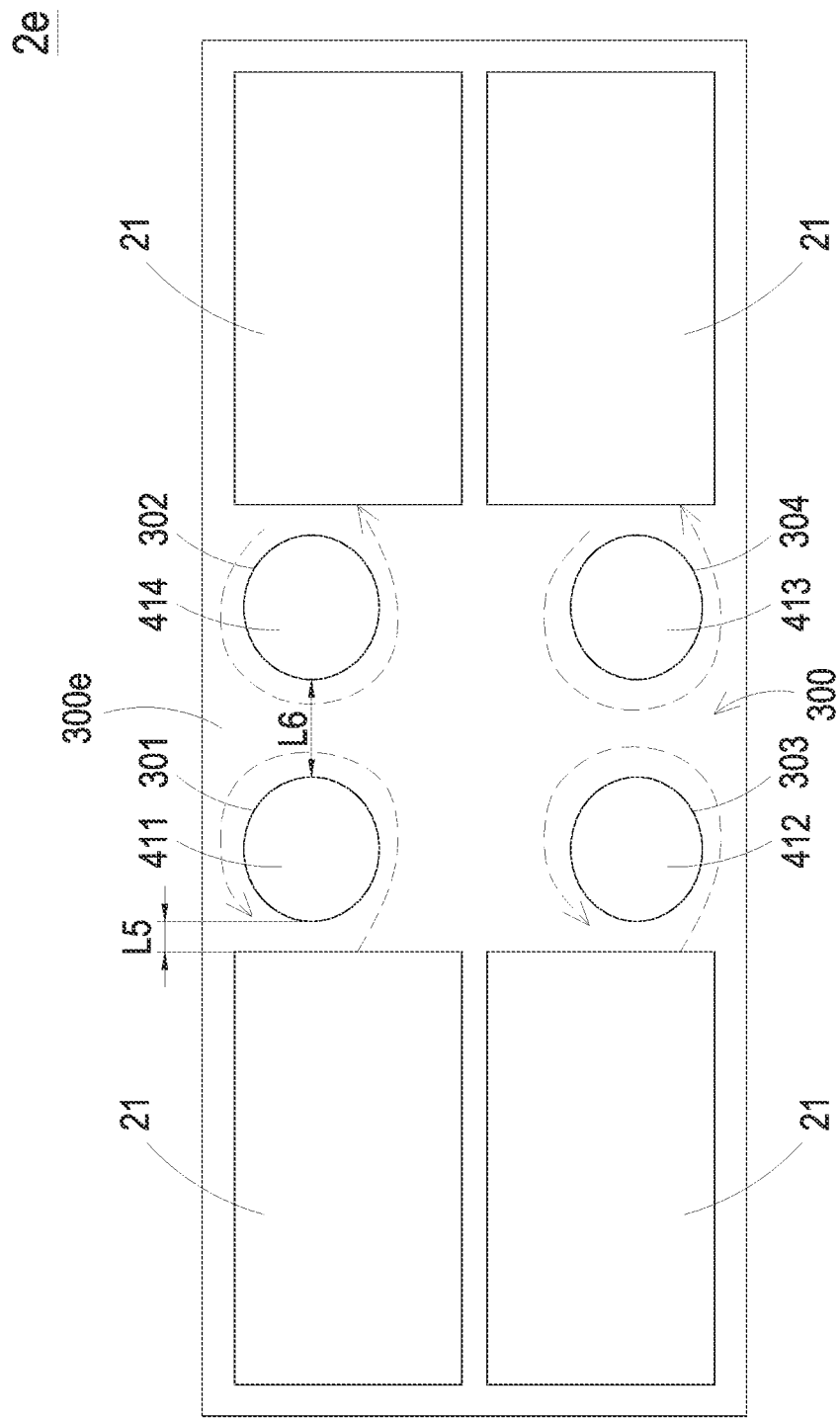
FIG. 11 schematically illustrates the directions of the currents flowing through the four inductors of the voltage regulator module as shown in FIG. 10.

FIG. 11 schematically illustrates the directions of the currents flowing through the four inductors of the voltage regulator module as shown in FIG. 10. Please refer to FIGS. 9, 10 and 11. As shown in the drawings, the currents from the two switching circuits 21 flow through the lateral legs 411, 412, 413 and 414 of the magnetic core assembly 20a in a counterclockwise direction. Consequently, the directions of the DC magnetic fluxes flowing through the lateral legs 411, 412, 413 and 414 are identical and the DC magnetic loss is reduced. Moreover, the four switching circuits 21 are controlled according to the pulse width modulation signals PWM1, PWM3, PWM2 and PWM4. The phase difference between every two phase adjacent ones of the pulse width modulation signals PWM1, PWM3, PWM2 and PWM4 is 90 degree. Consequently, the directions of the AC magnetic fluxes flowing through the two lateral legs 411 and 414 are opposite, and the directions of the AC magnetic fluxes flowing through the two lateral legs 412 and 413 are opposite. In such way, the AC magnetic fluxes are partially or completely balanced out, the AC magnetic loss is reduced, the ripple current of the equivalent inductance is largely reduced, and the ability of the inductors L to withstand the saturation is enhanced.

The directions of the currents flowing through the inductors L are not restricted as long as the directions of the DC magnetic fluxes flowing through the lateral legs 411, 412, 413 and 414 are identical and the directions of the AC magnetic fluxes are opposite. For example, in another embodiment, the currents flow through the lateral legs 411, 412, 413 and 414 of the magnetic core assembly 20 in a clockwise direction. The phase difference between every two phase adjacent ones of the pulse width modulation signals PWM1, PWM3, PWM2 and PWM4 is in the range between 60 and 120 degree (e.g., 90 degree). Consequently, the AC magnetic loss is reduced, and the ripple current of the inductors is decreased.

The two lateral legs 411 and 414 are arranged between the two switching circuits 21 that are controlled according to the pulse width modulation signals PWM1 and PWM4, wherein the phase difference between the pulse width modulation signals PWM1 and PWM4 is 90 degree. The two lateral legs 411 and 414 are arranged in a row along the first direction. The two lateral legs 412 and 413 are arranged between the two switching circuits 21 that are controlled according to the pulse width modulation signals PWM2 and PWM3, wherein the phase difference between the pulse width modulation signals PWM2 and PWM3 is 90 degree. The two lateral legs 412 and 413 are arranged in another row along the first direction. In each row, two times the shortest distance between each lateral post and the adjacent switching circuit 21 is less than the shortest distance between the two adjacent lateral posts. For example, two times the shortest distance L5 between the lateral post 411 and the adjacent switching circuit 21 is less than the shortest distance L6 between the two lateral legs 411 and 414.

Figure 12:
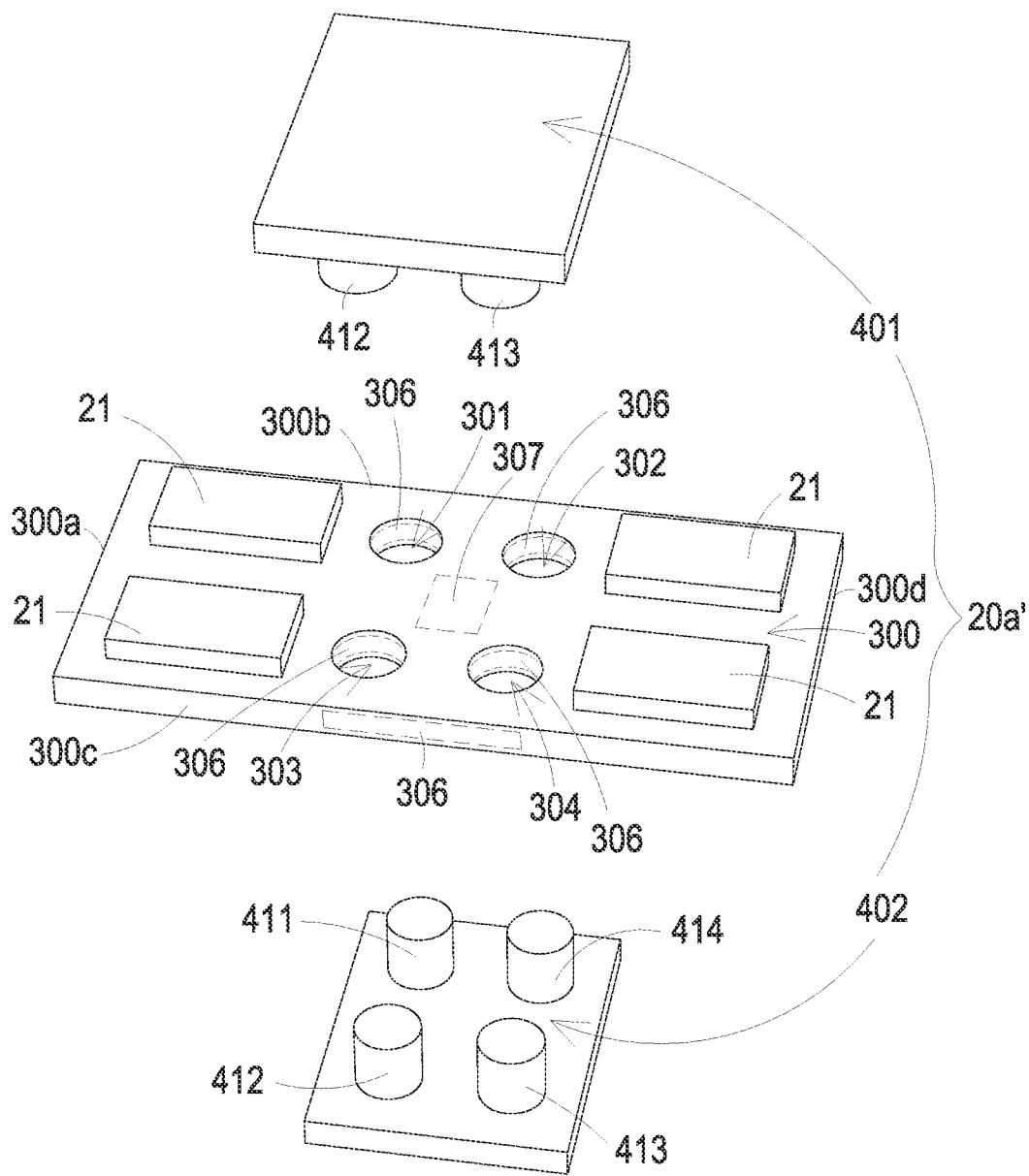
FIG. 12 is a schematic exploded view illustrating the structure of a voltage regulator module according to a seventh embodiment of the present disclosure.

FIG. 12 is a schematic exploded view illustrating the structure of a voltage regulator module according to a seventh embodiment of the present disclosure. In comparison with the sixth embodiment, the magnetic core assembly 20a' of the voltage regulator module 2f of this embodiment omits the middle leg. That is, the magnetic core assembly 20a' includes the lateral legs 411, 412, 413 and 414 only, and the entire of the middle leg 415 of the sixth embodiment is replaced by the air gap. Moreover, the circuit board 300 omits the receiving recess 305. Moreover, the circuit board 300 further includes a clearance region 307. The clearance region 307 is arranged between the openings 301, 302, 303 and 304. Especially, no electronic components, planar winding assemblies or electric traces are located at the region of the circuit board 300 corresponding to the clearance region 307. Consequently, the magnetic force lines with the direction opposite to the magnetic force lines of the lateral legs 411, 412, 413 and 414 can pass through the circuit board 300 through the clearance region 307.

It is noted that numerous modifications and alterations may be made while retaining the teachings of the disclosure. For example, the conductive structure of the circuit board is not restricted to the planar winding assembly. Like the embodiment of FIG. 7B, copper blocks are embedded in the circuit board 300 to replace the planar winding assemblies. Like the embodiments of FIGS. 7A and 7B, copper blocks are disposed on the bottom surface of the circuit board and electrically connected with the corresponding terminals of the voltage regulator module. Like the embodiment of FIG. 8, a molding compound layer is disposed on the bottom surface 300f of the circuit board 300, the molding compound layer is polished to expose the copper blocks, and a plurality of electroplated patterns are formed on the external surface of the molding compound layer by an electroplating process.

In the embodiment of FIG. 9, the voltage regulator module includes four parallel-connected single-phase buck circuits. The voltage regulator module of FIG. 9 may be modified. In a variant example, the voltage regulator module includes two two-phase buck circuits as shown in FIG. 2.

As mentioned above, the voltage regulator module includes 2N switching circuits, 2N input capacitors and 2N inductors, wherein N is an integer. The 2N inductors are magnetic integrated inductors. The 2N switching circuits and the 2N inductors are horizontally arranged on the circuit board. Each inductor is electrically connected with the corresponding switching circuit. That is, the 2N inductors and the 2N switching circuits are collaboratively formed as a 2N-phase buck circuit. Every two switching circuits are connected with each other in parallel. Moreover, every two switching circuits are arranged side by side along the second direction and defined as one switching circuit group. The phase difference between the control signals for controlling the two switching circuits of the switching circuit group is in the range between 150 and 210 degree. The 2N switching circuits are defined as N switching circuit groups. The phase difference between the control signals for controlling the two corresponding switching circuits of every two phase adjacent switching circuit groups is in the range between (360/2N−30) and (360/2N+30) degree.

FIG. 13 schematically a voltage regulation device according to an embodiment of the present disclosure. The voltage regulation device 5 includes a plurality of voltage regulator modules 50. The voltage regulator modules 50 have the same circuitry structure. For succinctness, only two voltage regulator modules 50 are shown in FIG. 13. Any of the voltage regulator modules as described in the above embodiments can be used as the voltage regulator module 50. In an embodiment, the phase difference between the control signals for controlling the switching circuits 21 of every two corresponding voltage regulator modules 50 is in the range between −30 degree and 30 degree (e.g., 0 degree). Alternatively, the phase difference between the control signals for controlling the switching circuits 21 of every two phase adjacent voltage regulator module 50 is in the range between (360/(2×N×X)−30) degree and (360/(2×N×X)+30) degree, wherein the 2N is the number of the switching circuits 21 and X is the number of the voltage regulator modules 50. For example, the phase difference is 360/(2×N×X) degree. Alternatively, the phase difference between the control signals for controlling the switching circuits 21 of every two phase adjacent voltage regulator module 50 is in the range between (360/(N×X)−30) degree and (360/(N×X)+30) degree. For example, the phase difference is 360/(N×X) degree.

In an embodiment, the voltage regulation device 5 includes five parallel-connected voltage regulator modules 50, and the voltage regulator module 50 has the circuitry structure of the voltage regulator module 2 as shown in FIG. 3A. The control signals for controlling the switching circuits of the voltage regulator module 2 include the two pulse width modulation signals PWM1 and PWM2. For example, the phase difference between the control signals PWM1 for controlling the switching circuits of every two phase adjacent voltage regulator modules 2 of the five voltage regulator modules 2 is in the range between −30 degree and 30 degree (e.g., 0 degree), and the phase difference between the control signals PWM2 for controlling the switching circuits of every two phase adjacent voltage regulator modules 2 of the five voltage regulator modules 2 is in the range between −30 degree and 30 degree (e.g., 0 degree).

For example, the voltage regulation device 5 includes five parallel-connected voltage regulator modules 50, and the voltage regulator module 50 has the circuitry structure of the voltage regulator module 2 as shown in FIG. 3A. For example, the phase difference between the control signals PWM1 for controlling the switching circuits of every two phase adjacent voltage regulator modules 2 of the five voltage regulator modules 2 is in the range between (360/10−30) degree and (360/(10)+30) degree, e.g., 36 degree. That is, the phase difference between the control signals PWM1 for controlling the first switching circuits of the first voltage regulator module and the second voltage regulator module is 36 degree. Similarly, the phase difference between the control signals PWM1 for controlling the first switching circuits of the second voltage regulator module and the third voltage regulator module is 36 degree. The rest may be deduced by analogy.

In some embodiments, the circuit board is a multi-layered circuit board. The conductive structure and the switching circuits are embedded in the circuit board. The switching circuits are located above the conductive layer. The benefits of the horizontal layout structure are also achievable. Since the height of the voltage regulator module is largely reduced, the voltage regulator module can meet the requirement of ultra-slimness.

From the above descriptions, the present disclosure provides a voltage regulator module and a voltage regulation device. The inductors and the switching circuits of the voltage regulator module are horizontally arranged on the circuit board. When compared with the conventional voltage regulator module having the vertical layout structure, the height of the voltage regulator module of the present disclosure is largely reduced. Since the inductors of the voltage regulator module are magnetic integrated inductor, the volume of the inductor is reduced. Consequently, the volume and the height of the voltage regulator module can be further reduced. For example, the overall thickness of the voltage regulator module is less than or equal to 5 mm, preferably less than or equal to 3 mm. Consequently, the voltage regulator module can meet the requirement of ultra-slimness. Moreover, the inductors and the switching circuits of the voltage regulator module are closely and horizontally arranged on the circuit board, and the capacitor group is disposed on the bottom surface of the circuit board and aligned with the switching circuits. Consequently, the size of the overall product is reduced. In other words, the voltage regulator module has many benefits such as miniaturization, small package area and high power density.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module comprising:
   a circuit board;
   a positive input terminal;
   a negative input terminal;
   a positive output terminal;
   a negative output terminal;
   at least one switching circuit disposed on a top surface of the circuit board, and comprising at least two switches connected in series to form a midpoint, wherein a first terminal of the switching circuit is connected to the positive input terminal;
   at least one magnetic element comprising a magnetic core and at least one conductive structure in the circuit board, wherein the magnetic core and the at least one conductive structure are assembled together, wherein the at least one magnetic element and the at least one switching circuit are arranged on the circuit board along a first direction, a first terminal of the at least one conductive structure is connected to the midpoint of the corresponding switching circuit, and a second terminal of the at least one conductive structure is connected to the positive output terminal; and
   at least one input capacitor connected to the positive input terminal and the negative input terminal, and disposed on a bottom surface of the circuit board.

2. The voltage regulator module according to claim 1, wherein the negative input terminal and the negative output terminal are electrically connected with each other.

3. The voltage regulator module according to claim 1, wherein the at least one switching circuit comprises two parallel-connected switching circuits arranged on the circuit board along a second direction.

4. The voltage regulator module according to claim 3, wherein a phase difference between two control signals for controlling the two parallel-connected switching circuits is in a range between 150 and 210 degree.

5. The voltage regulator module according to claim 3, wherein the at least one conductive structure comprises two conductive structures, and the magnetic core and the two conductive structures are assembled together to form two inductors, wherein each inductor is connected to the corresponding switching circuit and the positive output terminal.

6. The voltage regulator module according to claim 5, wherein the magnetic core comprises an upper core, a lower core and two lateral legs;
   and the circuit board comprises two openings, wherein the two lateral legs are penetrated through the corresponding openings, so that the two inductors are defined by the magnetic core and the corresponding conductive structure collaboratively.

7. The voltage regulator module according to claim 6, wherein the circuit board comprises a first lateral edge, a second lateral edge, a third lateral edge and a fourth lateral edge, wherein the first lateral edge and the second lateral edge are opposed to each other, the third lateral edge and the fourth lateral edge are arranged between the first lateral edge and the second lateral edge, and the third lateral edge and the fourth lateral edge are opposed to each other, wherein the two openings are arranged between the corresponding switching circuits and the second lateral edge, and the shortest distance between each opening and the corresponding switching circuit is less than the shortest distance between the opening and the second lateral edge.

8. The voltage regulator module according to claim 7, wherein electroplated structures are formed on inner walls of the two openings, and the electroplated structures are connected with the corresponding conductive structure.

9. The voltage regulator module according to claim 7, wherein the conductive structures of the two inductors are located near the second lateral edge, the third lateral edge and the fourth lateral edge of the circuit board, and electroplated structures are formed on the second lateral edge, the third lateral edge and the fourth lateral edge of the circuit board and electrically connected with the corresponding conductive structure.

10. The voltage regulator module according to claim 1, wherein the at least one input capacitor and the at least one switching circuit are located over or under the at least one conductive structure and arranged along a third direction.

11. The voltage regulator module according to claim 1, wherein the at least one switching circuit comprises four switching circuits, the four switching circuits are divided into two switching circuit groups, wherein each switching circuit group comprises two parallel-connected switching circuits arranged on the circuit board along a second direction, and the two switching circuit groups and the magnetic core are arranged on the circuit board along the first direction.

12. The voltage regulator module according to claim 11, wherein a phase difference between two control signals for controlling the two switching circuits of each switching circuit group is in a range between 150 and 210 degree, and a phase difference between two control signals for controlling the two corresponding switching circuits of every two phase adjacent switching circuit groups is in a range between 60 and 120 degree.

13. The voltage regulator module according to claim 11, wherein the magnetic core comprises four lateral legs, and the circuit board comprises four openings, wherein the four lateral legs are penetrated through the corresponding openings, so that four inductors are defined by the magnetic core and the corresponding conductive structures collaboratively, wherein two inductor groups are defined by the four inductors collaboratively, a first switching circuit group and a second switching circuit group are defined by the four switching circuits collaboratively, and the magnetic core is arranged between the two switching circuit group along the first direction.

14. The voltage regulator module according to claim 13, wherein the circuit board comprises a first lateral edge, a second lateral edge, a third lateral edge and a fourth lateral edge, wherein the first lateral edge and the second lateral edge are opposed to each other, the third lateral edge and the fourth lateral edge are arranged between the first lateral edge and the second lateral edge, and the third lateral edge and the fourth lateral edge are opposed to each other, wherein the two switching circuits of the first switching circuit group are located near the first lateral edge, the third lateral edge and the fourth lateral edge of the circuit board, the two switching circuits of the second switching circuit group are located near the second lateral edge, the third lateral edge and the fourth lateral edge of the circuit board, and the magnetic core is located at a middle region of the circuit board and arranged between the first switching circuit group and the second switching circuit group.

15. The voltage regulator module according to claim 13, wherein two of the fourth lateral legs are arranged in a first row along the first direction, and the other two of the fourth lateral legs are arranged in a second row along the first direction, wherein two times the shortest distance between each lateral leg in the first row and the adjacent switching circuit is less than the shortest distance between the two lateral legs in the first row, and two times the shortest distance between each lateral leg in the second row and the adjacent switching circuit is less than the shortest distance between the two lateral legs in the second row.

16. The voltage regulator module according to claim 14, wherein the conductive structures of the four inductors are located near the third lateral edge or the fourth lateral edge of the circuit board, and electroplates structures are formed on the third lateral edge and the fourth lateral edge and electrically connected with the corresponding conductive structures.

17. The voltage regulator module according to claim 14, wherein electroplated structures are formed on inner walls of the four openings, and the electroplated structures are connected with the corresponding conductive structures.

18. The voltage regulator module according to claim 1, wherein the at least one conductive structure is a planar winding assembly in the circuit board, or the conductive structure is a copper block that is embedded in the circuit board.

19. The voltage regulator module according to claim 1, wherein the voltage regulator module further comprises at least one copper block, wherein the at least one copper block is disposed on the bottom surface of the circuit board, and electrically connected with at least one terminal of the circuit board.

20. The voltage regulator module according to claim 19, wherein the voltage regulator module further comprises a molding compound layer, wherein the molding compound layer is disposed on the bottom surface of the circuit board, and components on the bottom surface of the circuit board and the bottom surface of the circuit board are encapsulated by the molding compound layer, wherein after an external surface of the molding compound layer is polished, the at least one copper block is exposed and a plurality of electroplated patterns are formed on the external surface of the molding compound layer by an electroplating process, wherein the plurality of electroplated patterns are used as pins of the voltage regulator module.

21. A voltage regulation device disposed on a system board, the voltage regulation device comprising a plurality of voltage regulator modules, wherein the plurality of voltage regulator modules are connected with each other in parallel, circuitry structures of the plurality of voltage regulator modules are identical, and each voltage regulator module comprises:
a circuit board;
a positive input terminal;
a negative input terminal;
a positive output terminal;
a negative output terminal;
at least one switching circuit disposed on a top surface of the circuit board, and comprising at least two switches connected in series to form a midpoint, wherein a first terminal of the switching circuit is connected to the positive input terminal;
at least one magnetic element comprising a magnetic core and at least one conductive structure in the circuit board, wherein the magnetic core and the at least one conductive structure are assembled together, wherein the at least one magnetic element and the at least one switching circuit are arranged on the circuit board along a first direction, a first terminal of the at least one conductive structure is connected to the midpoint of the corresponding switching circuit, and a second terminal of the at least one conductive structure is connected to the positive output terminal; and
at least one input capacitor connected to the positive input terminal and the negative input terminal, and disposed on a bottom surface of the circuit board.

22. The voltage regulation device according to claim 21, wherein a phase difference between two control signals for controlling the two corresponding switching circuits of every two phase adjacent voltage regulator modules is in a range between −30 degree and 30 degree.

23. The voltage regulation device according to claim 21, wherein each voltage regulator module comprises 2N switching circuits, a phase difference between two control signals for controlling the two corresponding switching circuits of every two phase adjacent voltage regulator modules is in a range between (360/(2×N×X)−30) degree and (360/(2×N×X)+30) degree, wherein X is a number of the plurality of voltage regulator modules.

24. The voltage regulation device according to claim 21, wherein each voltage regulator module comprises 2N switching circuits, a phase difference between two control signals for controlling the two corresponding switching circuits of every two phase adjacent voltage regulator modules is in a range between $(360/(N \times X)-30)$ degree and $(360/(N \times X)+30)$ degree, wherein X is a number of the plurality of voltage regulator modules.

* * * * *